(12) United States Patent
Shi et al.

(10) Patent No.: US 11,069,974 B2
(45) Date of Patent: Jul. 20, 2021

(54) OPTICALLY FED ANTENNA AND OPTICALLY FED ANTENNA ARRAY

(71) Applicant: PHASE SENSITIVE INNOVATIONS, INC., Newark, DE (US)

(72) Inventors: Shouyuan Shi, Newark, DE (US); Jian Bai, Temple, AR (US); Chris Schuetz, Avondale, PA (US); Garrett Schneider, New Castle, DE (US); Dennis Prather, Newark, DE (US)

(73) Assignee: Phase Sensitive Innovations, Inc., Newark, DE (US)

( * ) Notice: Subject to any disclaimer, the term of this patent is extended or adjusted under 35 U.S.C. 154(b) by 0 days.

(21) Appl. No.: 16/687,119

(22) Filed: Nov. 18, 2019

(65) Prior Publication Data

US 2020/0091603 A1 Mar. 19, 2020

Related U.S. Application Data

(63) Continuation of application No. 15/242,459, filed on Aug. 19, 2016, now Pat. No. 10,490,893.

(Continued)

(51) Int. Cl.
*H01Q 9/28* (2006.01)
*H01Q 3/26* (2006.01)
*H01Q 21/06* (2006.01)

(52) U.S. Cl.
CPC .......... *H01Q 3/2676* (2013.01); *H01Q 9/285* (2013.01); *H01Q 21/062* (2013.01); *H01L 2224/48091* (2013.01); *H01L 2224/48227* (2013.01)

(58) Field of Classification Search
CPC .... H01Q 3/2676; H01Q 9/285; H01Q 21/062; H01L 2224/48091; H01L 2224/48227
See application file for complete search history.

(56) References Cited

U.S. PATENT DOCUMENTS

| 7,408,507 B1 | 8/2008 | Paek et al. |
| 2005/0057431 A1 | 3/2005 | Brown et al. |

(Continued)

FOREIGN PATENT DOCUMENTS

EP 2363729 A1 9/2011

OTHER PUBLICATIONS

N. Shimizu and T. Nagatsuma, "Photodiode-integrated microstrip antenna array for subterahertz radiation," in IEEE Photonics Technology Letters, vol. 18, No. 6, pp. 743•745, Mar. 15, 2006 (Mar. 15, 2006) [retrieved on line Jun. 7, 2017 from URL: http://ieeexplore.ieee.org/stamp/stamp.jsp?tp=&arnumber=1599428&isnumber=33633].

(Continued)

*Primary Examiner* — Awat M Salih
(74) *Attorney, Agent, or Firm* — Muir Patent Law, PLLC

(57) ABSTRACT

An optically-fed tightly-coupled array (TCA) antenna comprises a plurality of photodiodes and antennas. Each photodiode may receive an optical signal from an optical fiber and convert the optical signal into an RF driving signal to drive a corresponding antenna to which it is connected. Each photodiode may be connected to the antenna. In some examples, the TCA is capable of ultra-wideband operation ranging from 2-12 GHz and wide beam-steering capability up to 40° from the broadside. Inductance peaking and resistance matching may be employed.

25 Claims, 25 Drawing Sheets

Related U.S. Application Data

(60) Provisional application No. 62/207,081, filed on Aug. 19, 2015.

(56) References Cited

U.S. PATENT DOCUMENTS

| | | |
|---|---|---|
| 2006/0065856 A1 | 3/2006 | Diaz et al. |
| 2007/0262777 A1 | 11/2007 | Warntjes et al. |
| 2009/0168367 A1 | 7/2009 | Fujii |
| 2010/0231453 A1 | 9/2010 | Shinkai et al. |
| 2012/0019426 A1 | 1/2012 | Galluppi |
| 2014/0231627 A1 | 8/2014 | Wakatsuki et al. |
| 2014/0334565 A1* | 11/2014 | Tzanidis ............... H01Q 21/20 375/267 |

OTHER PUBLICATIONS

Kejia Li et al., "High-Power Photodiode Integrated With Coplanar Patch Antenna for 60-GHz Applications," IEEE Photonics Technology Letters, vol. 27, No. 6, pp. 650-653, Mar. 15, 2015.

Zhi Li et al., "High-power high-linearity flip-chip bonded modified uni-traveling carrier photodiode," vol. 19, No. 26, Optics Express, Nov. 18, 2011.

Written Opinion dated Jul. 14, 2017 for International Application PCT/US16/47921.

* cited by examiner

20-GHz Photodiode

OPTICALLY FED ANTENNA AND OPTICALLY FED ANTENNA ARRAY

CROSS-REFERENCES TO RELATED APPLICATIONS

This application is a Continuation of and claims priority to U.S. application Ser. No. 15/242,459 filed Aug. 19, 2016 which claims the benefit of U.S. Provisional Application No. 62/207,081, filed on Aug. 19, 2015, both of these applications being incorporated herein by reference in their entirety.

GOVERNMENT SUPPORT

The subject matter herein disclosed was made with partial government funding and support under the Meta-program from Air Force Research Laboratory at Wright Paterson AFB under Contract No. FA8650-090-D-5037. The government has certain rights in this invention.

FIELD OF TECHNOLOGY

The herein described subject matter and associated exemplary implementations are directed to an antenna and an antenna array. Examples of an optically fed antenna and an array of optically fed antennas, are disclosed.

BACKGROUND

Conformal, low profile, and wideband phased arrays have received increasing attention due to their potential to provide multiple functionalities over several octaves of frequency, using shared common apertures for various applications, such as radar, ultra-fast data-links, communications, RF sensing, and imaging. These arrays offer tremendous advantages, including multiple independently steerable beams, polarization flexibility, and high reliability.

To achieve ultra-wideband operation, numerous array antennas, such as tapered-slot-antennas or Vivaldi arrays, "bunny ear" arrays, long-slot arrays, and tightly-coupled arrays (TCA), have been proposed.

Since the radiating elements of an antenna in an antenna array, such as the TCA, may take symmetric forms, such as dipoles and bowties, wideband balanced feeding is often used to excite the antenna to attain an antisymmetric current distribution (i.e. with currents in the two dipole arms equal in amplitude and 180° out of phase). Unbalanced feeding will result in common mode excitation, impedance instability, and/or high cross-polarization, thereby significantly degrading the operational bandwidth.

In certain antenna arrays, such as the TCA, the high input resistance imposes another difficulty, namely to provide appropriate impedance matching with a conventional 50-Ω coaxial line. As a result, a balanced-to-unbalanced transformer, i.e., a balun, as well as an impedance transformer, is typically provided for each radiating element. The use of these transformers, however, can impose additional restrictions on the performance of the antenna array, such as the bandwidth, operational frequency, weight and profile, particularly at high operational frequencies, conformability, overall compactness and the additional relative high costs of these components.

In addition, such electrically fed phased arrays may be also subjected to scan blindness, a common phenomenon that occurs due to a large input mismatch at a certain scan angle when a spatial harmonic of the periodic array resonates with antenna feed circuitry. This may limit the scan range of the phased arrays.

SUMMARY

The disclosed optically-fed transmitting phased-array architecture, transmitting signals are converted from the electrical domain to the optical domain by using electro-optic (EO) modulators and photodiodes. RF signals generated from a relatively low frequency source are up-converted into the multiple sidebands of an optical carrier signal. This modulated optical signal can be remotely imparted to photodiodes via optical fibers. Desired RF signals may be recovered by photo-mixing at the photodiodes and then transmitted to radiating elements of the antennas.

In each frontend module of the transmitter, a photodiode may be directly integrated with the radiator. Each active element of the array may receive a signal and may be driven via an optical fiber. Use of an RF transmission line to drive the radiating elements of the antenna may be avoided.

Exemplary antennas and arrays described herein may avoid use of typical feeding RF lines, RF amplifiers and/or baluns that are often implemented in certain conventional systems, although it will be apparent that the invention may be implemented with such structure as desired.

DETAILED DESCRIPTION

Figure 1:
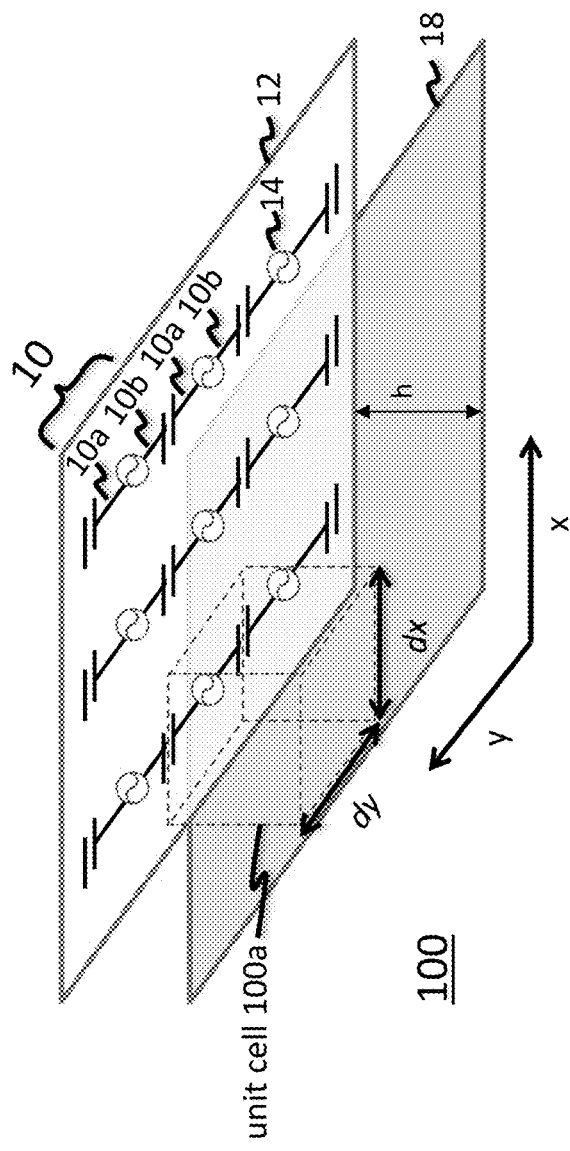
FIG. 1 is a schematic diagram of a photodiode driven connected dipole array.

The present disclosure now will be described more fully hereinafter with reference to the accompanying drawings, in which various exemplary implementations are shown. The invention may, however, be embodied in many different forms and should not be construed as limited to the exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary implementations, when taking the figures and their description as a whole into consideration.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Terms such as "about" or "approximately" or "on the order of" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, an electrically conductive component (e.g., a wire, pad, internal electrical line, etc.) may be physically connected to but not electrically connected to an electrically insulative component (e.g., a polyimide layer of a printed circuit board, an electrically insulative adhesive connecting two devices, an electrically insulative underfill or mold layer, etc.). Moreover, items that are "directly electrically connected," to each other may be electrically connected through one or more connected conductors, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

FIG. 1 illustrates one example embodiment of an antenna array 100. The antenna array 100 may have a low profile, be light weight, and/or have good conformability (e.g., where the antennas of the antenna array are not all located in a single plane, such as being mounted on a surface of a convex shaped hull or wing of an aircraft). Although the embodiment of FIG. 1 is implemented with dipole antennas 10 and relates to a TCA antenna array of dipole antennas 10, it will be apparent that the invention is applicable to single antennas that need not be part of an array, as well as other types of antenna array. For example, the invention may be implemented (as an array or as a single antenna) with other antennas and with dipole antennas having different configurations, including monopole antennas, horn antennas, fractal antennas, loop antennas, patch antennas, spiral antennas, etc. The antenna array may be implemented as a current sheet antenna (CSA) that can be realized by connected-dipole arrays wherein adjacent dipoles are connected. CSAs may take many different forms of antennas such as: connected-dipole arrays which may possess lower cross polarization in radiation, less reactive energy confined in the feed, and broader impedance matching independently from the scan angle; interleaved spiral arrays which may have a wide bandwidth (often with relatively high cross polarization); and fragment arrays which may exploit a genetic algorithm (GA) to synthesize broadband apertures.

The exemplary implementation of a photodiode-coupled TCA 100 shown in FIG. 1 is comprised of an array of dipole antennas 10 excited by photodiodes 14 arranged on a substrate 12. Each unit cell 100a of the TCA 100 comprises a dipole antenna 10 having two conductive radiating arms 10a and 10b and a photodiode 14 electrically connected to radiating arms 10a and 10b to act as a driving source for the dipole antenna 10 of the unit cell. In this example, the TCA 100 comprises a plurality of unit cells 100a regularly arranged in the x and y directions of FIG. 1. The unit cells 100a (and thus the structure of the unit cells 100a, including the dipole antennas 10 and photodiodes 14) are arranged on the substrate 10 with a pitch of dx along the x-axis and with a pitch of dy along the y-axis.

Specifically, for each pair of a dipole antenna 10 a photodiode 14 of a unit cell 100a, an anode of the photodiode 14 is electrically connected to one of the radiating arms 10a and a cathode of the photodiode 14 is connected electrically connected to another of the radiating arms 10b. In this example, the radiating arms 10a and 10b of the dipole antenna extend away lengthwise in the y-direction from the photodiode 14 to which they are connected. Dipole antennas 10 are aligned on substrate 12 in rows extending in the y-direction and radiating arms 10a, 10b of neighboring dipole antennas 10 in the y-direction are electrically connected via a capacitor 16.

Substrate 12 may be a single printed circuit board or a group of interconnected circuit boards. The printed circuit board(s) forming substrate 12 may comprise a stack of insulating layers (e.g., polyimide) that insulate wiring disposed between the insulating layers, the wiring providing electrical connections (discussed below) to the dipole antennas 10. The substrate 12 need not be planar as shown in FIG. 1, and instead may comprise curved surfaces, such as a concave and/or convex surface. For example, the substrate 12 may comprise or be formed to conform to a curved surface (e.g., body or wing) of an aircraft. It will be appreciated that the positioning of the dipole antennas 10 are dependent on their placement on substrate 12 in this example, and thus may have the non-planar configuration described herein with respect to the substrate 12. The radiating arms 10a and 10b of the dipole antennas 10 may also be non-planar and have a curved shape to conform to a curved surface of the substrate 12 on which they are formed.

Ground plane 18 comprises a sheet metal spaced a constant distance h away from the dipole antennas 10 on the substrate 12. The distance may be about the distance of a quarter wavelength of the intermediate frequency of the operational frequency range. In an example where the operational frequency is 4-15 GHz, h may be about 6.5 mm+/−10% for example. However, other frequency ranges may allow for a different spacing h, such as less than 5 mm or less, such as between 10 mm and 50 mm, or greater. Ground plane 18 may also have the non-planar structure as described with respect to substrate 12 to conform to a non-planar positioning of the dipole antennas 10. While FIG. 1 has been shown to include a ground plane, other exemplary implementations operate without the provision of a ground plane.

Figure 2:
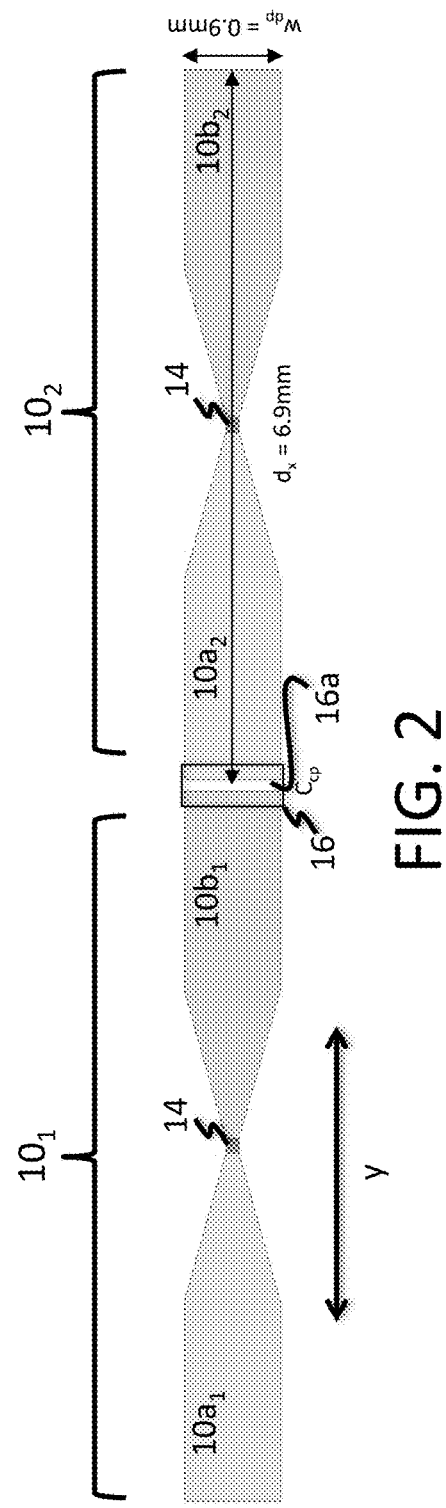
FIG. 2 illustrates exemplary details of two of the dipole antennas of two neighboring unit cells.

FIG. 2 illustrates exemplary details of two of the dipole antennas 10 of two neighboring unit cells 100a of FIG. 1. The two dipole antennas 10 are aligned in a row of a plurality of these dipole antennas 10, this row extending in the y-direction of FIG. 1. As shown in FIG. 2, the radiating arm $10b_1$ of dipole antenna $10_1$ is adjacent to radiating arm $10a_2$ of dipole antenna $10_2$. Dipole antennas $10_1$ and $10_2$ may have the same shape and size. In this example, the radiating arms 10a and 10b of the dipole antennas 10 are formed as metal plate or a planar sheet of metal, such as gold, silver or aluminum.

The radiating arms 10a and 10b may be formed by patterning a metal layer that has been deposited on substrate 12 using conventional printed circuit board manufacturing technology. For example radiating arms 10a and 10b may be formed by selectively etching a deposited metal layer using an etching mask. Alternatively, radiating arms 10a and 10b may be formed by printing a conductor onto substrate 12, such as, e.g., using a 3D printer, ink-jetting a conductive ink, etc.

Alternatively, the radiating arms 10a and 10b may be formed as a semiconductor chip and the semiconductor chip may be mounted to substrate 12. In this example, the photodiode 14 connected to the dipole antenna 10 may both be integrally formed as part of the same semiconductor chip. In this case, a metal layer (e.g., an uppermost metal layer or a metal layer deposited on the backside of the semiconductor wafer) of the semiconductor chip may be patterned using conventional semiconductor technology to form the radiating arms 10a and 10b of a dipole antenna 10. For example, an insulator may be patterned by etching using a photoresist or hard mask as an etchant mask, depositing metal within openings of and on upper surfaces of the patterned insulator and performing a chemical mechanical polishing (CMP) to remove the metal deposited on and to expose the upper surface of the patterned insulator and leave metal within the openings of the patterned insulator. In this example, the metal layer forming the radiating arms 10a and 10b may be the uppermost metal layer of the semiconductor chip (e.g., at the same level as an anode and/or cathode of a photodiode and/or chip pad of the semiconductor chip). However, the radiating arms 10a and 10b may be formed on a backside of a semiconductor substrate of the chip by patterning the backside of the semiconductor wafer (from which the semiconductor chip is later singulated) rather than the insulating layer as described above. The radiating arms 10a and 10b formed on the backside of the semiconductor chip may be connected to the anode and cathode of the integrated photodiode (formed on the front surface of the semiconductor wafer/chip) by through substrate vias (or through silicon vias).

Capacitor 16 electrically connects the dipole antennas $10_1$ and dipole antenna $10_2$. The capacitor 16 may be a discrete component with one electrode of the capacitor electrically connected to radiating arm $10b_1$ and the other electrode of the capacitor electrically connected to radiating arm $10a_2$. Instead of or in addition to a discrete component, the structure of the capacitor 16 may comprise the outer conductive surfaces of radiating arm $10b_1$ and radiating arm $10a_2$ (as the electrodes of the capacitor 16) and the insulative material (e.g., air, material of the substrate 12, such as polyimide) in the gap 16a between radiating arm $10b_1$ and radiating arm $10a_2$ (as the dielectric of the capacitor 16). To achieve a desired capacitance without use of an additional discrete capacitor, the spacing (e.g., the width of gap 16a) between the radiating arms $10b_1$ and $10a_2$ of neighboring dipole antenna $10_1$ and dipole antenna $10_2$ should be small, such as 50 um or less, 20 um or less or 5 um or less. The capacitance of capacitor 16 may then be 0.01 pF or more, or 0.02 pF or more. The shapes, dimensions and spacing shown in FIG. 2 are exemplary. In particular, the dimensions and capacitance values will be dependent on the desired frequency range of the dipole antenna 10 and/or antenna array 100 and can thus significantly vary from this embodiment.

Figure 3A:
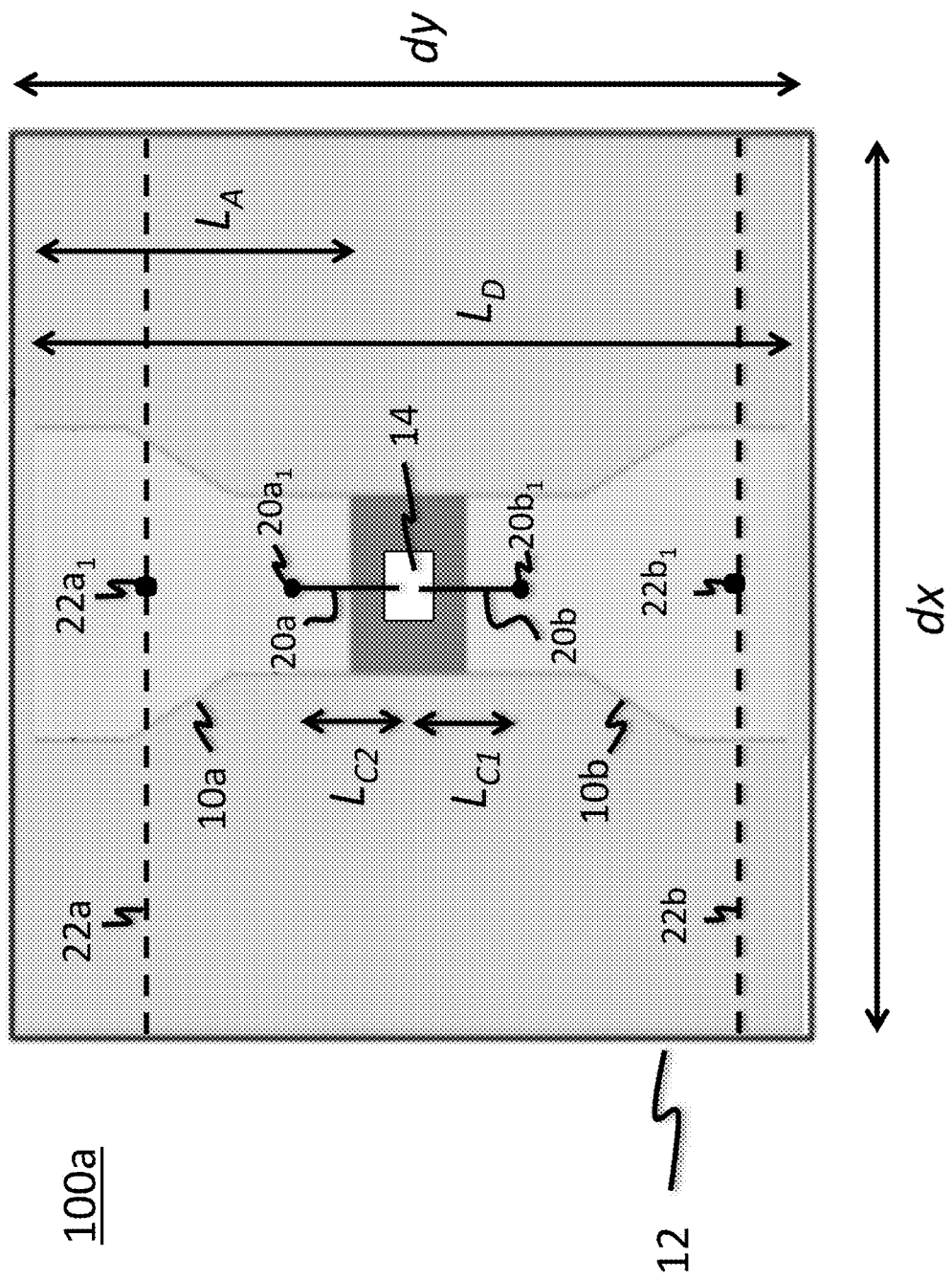
FIG. 3A is a simplified top down view and FIG. 3B is a bottom up view (absent the ground plane 18) of an exemplary unit cell.
Figure 3B:
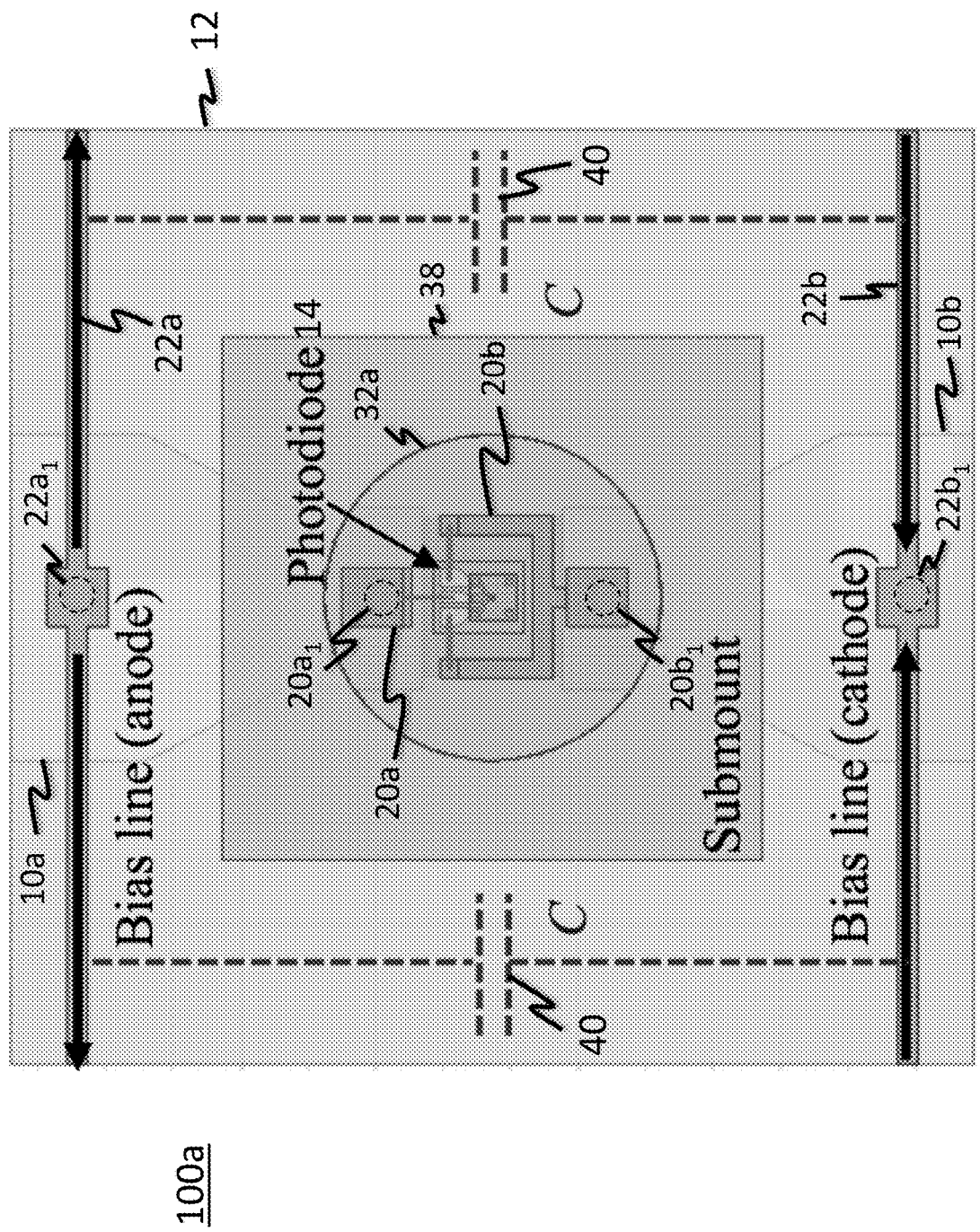
Figure 3C:
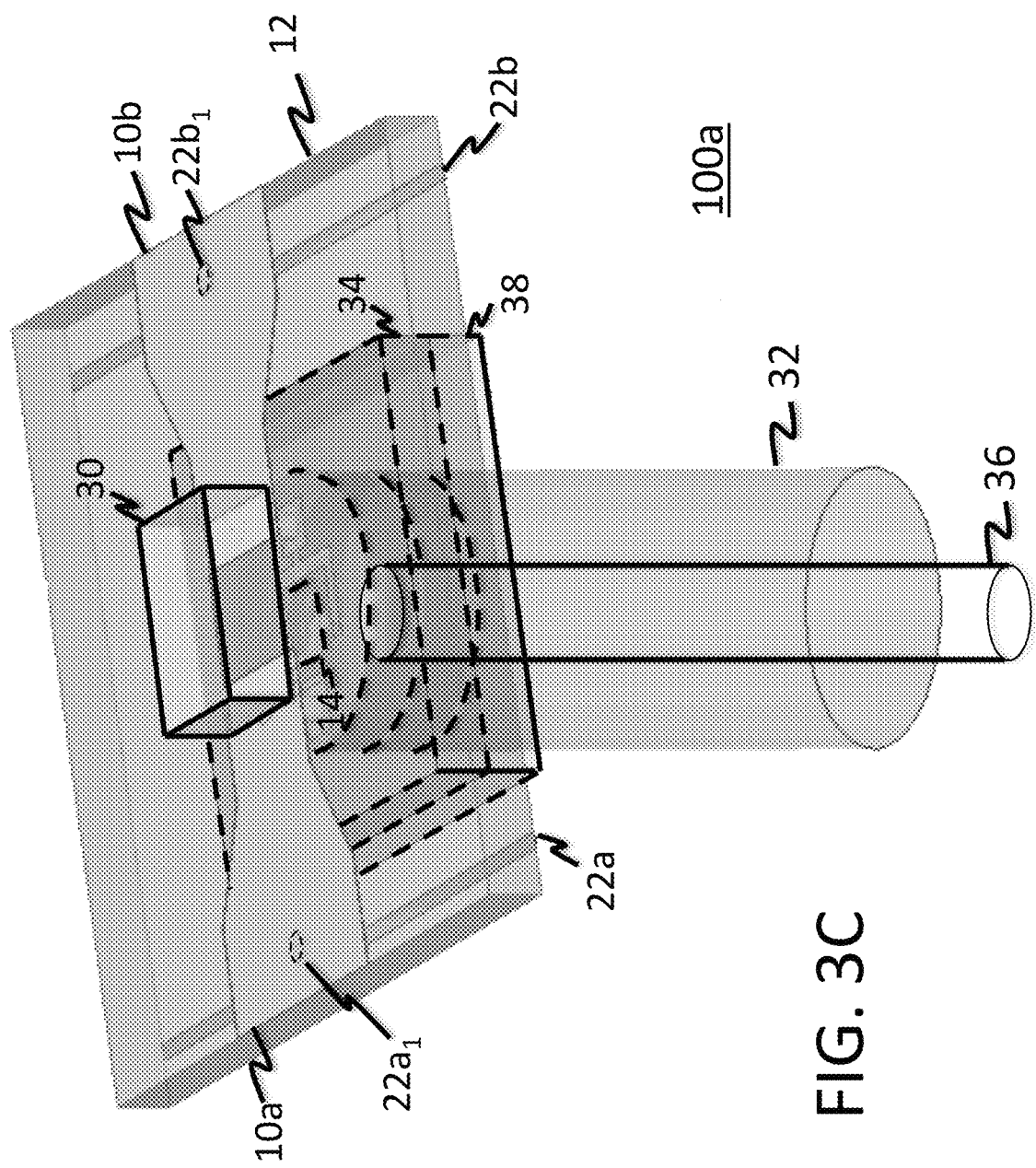
FIG. 3C is a perspective view of the unit cell.
Figure 3D:
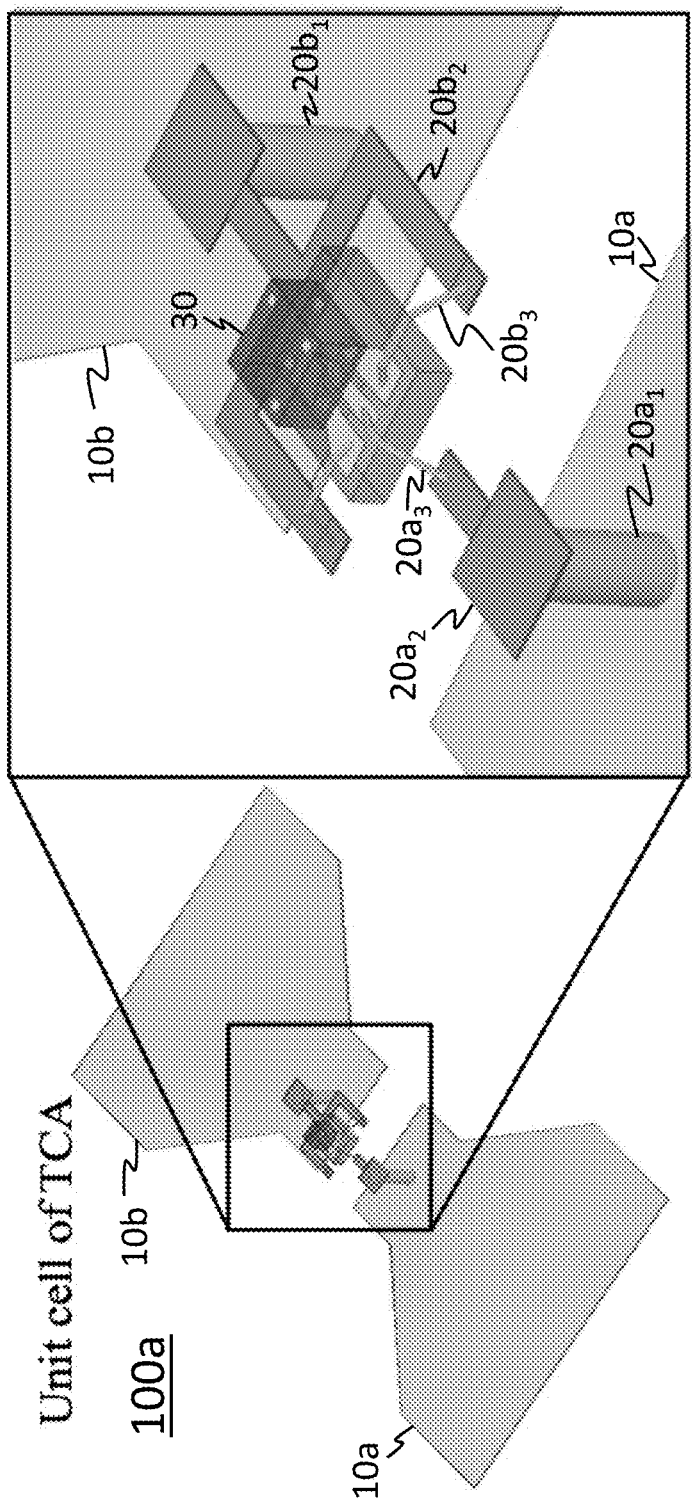
FIG. 3D is a perspective view of portions of the unit cell.
Figure 3E:
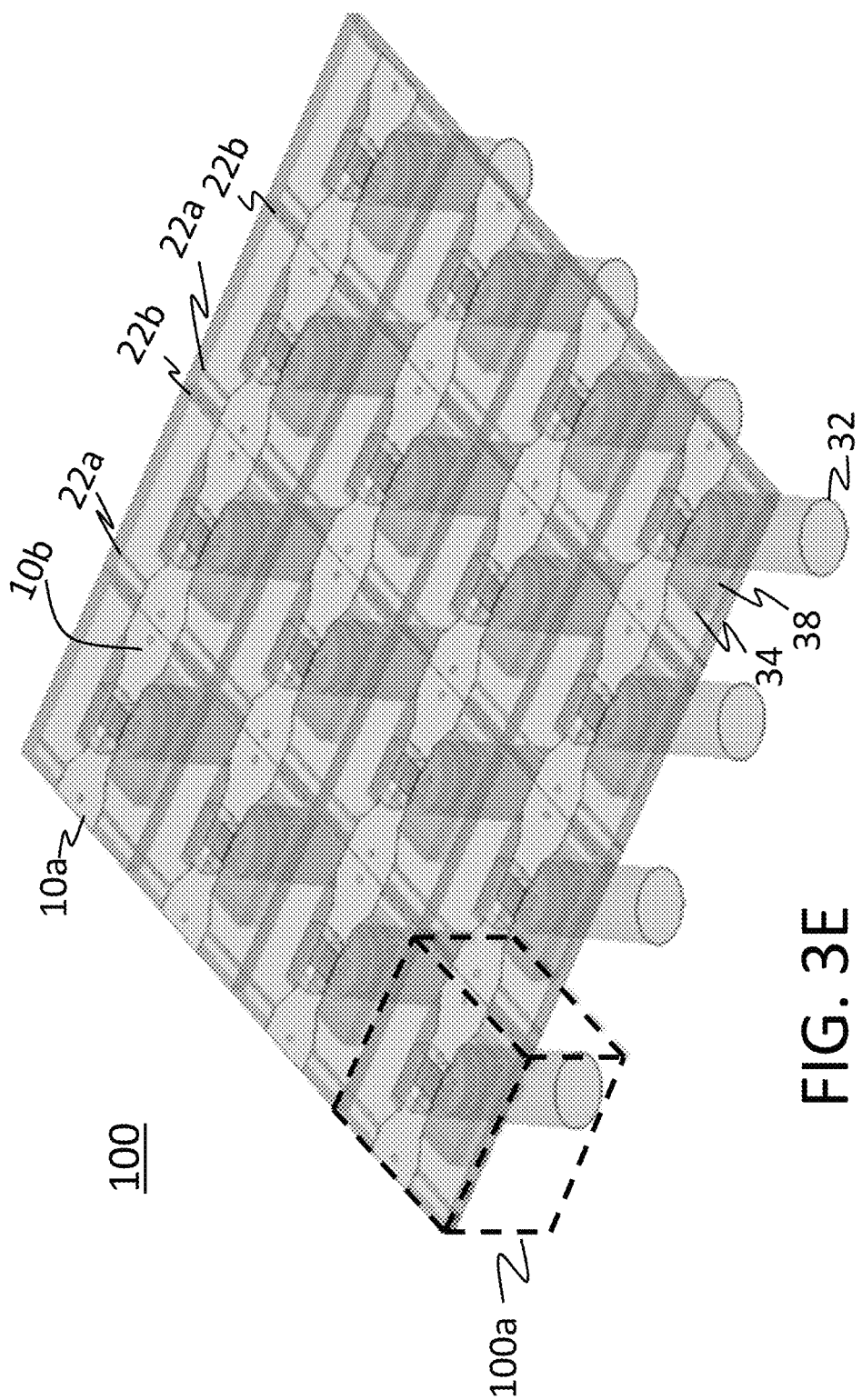
FIG. 3E is a perspective view of an array.

FIG. 3A is a simplified top down view and FIG. 3B is a bottom up view (absent the ground plane 18) of an exemplary unit cell 100a of the TCA 100 of FIG. 1. FIG. 3C is a perspective view of the unit cell 100a of the TCA 100 of FIG. 1 (with ground plane 18 removed). FIG. 3D is a perspective view of portions of the unit cell 100a with ground plane 18 and substrate 12 removed except for certain wiring of the substrate 12. All details described herein in connection with FIG. 2 also relate to the following description—only the shape of the radiating arms 10a and 10b of FIGS. 3A-3E differ from those shown in FIG. 2 but otherwise the details described and illustrated regarding FIG. 2 will be understood to be applicable to TCA 100 including the following description. FIG. 3E is a perspective view of TCA 100 comprising a 4×4 array of unit cells 100a of FIGS. 3A-3D.

As shown in FIGS. 3A, 3B, 3C and 3D, the unit cell 100a comprises a photodiode 14 electrically connected to radiating arms 10a and 10b of antenna 10 by conductors 20a and 20b respectively. Conductors 20a and 20b respectively connect to the bottom surface of the radiating arms 10a and 10b with a respective conductive vias $20a_1$ and $20b_1$ at a location spaced apart from the side edge of the respective radiating arm 20a and 20b. The conductors 20a and 20b may comprise, for example, wire bond wires or conductive posts that extend away from an upper surface of the respective one of radiating arm 10a and 10b.

As noted, the x-y dimensions (top down view dimensions) of the unit cell 100a are dx in the x direction and dy in the y direction. Both dx and dy should be chosen to be less than lambda/2 where lambda is the wavelength of the electromagnetic radiation emitted by TCA 100 at the highest frequency that TCA 100 is intended for use. The length of the dipole antenna 10 may be less than dy (e.g., by 5 um or less, 20 um or less or 50 um or less), or slightly less than lamda/2 in the substrate material to allow for a gap between neighboring dipole antennas 10 as discussed previously. The antenna is fabricated on a substrate with d a high dielectric constant, i.e., 3.66. For example, if the TCA antenna 100 is designed to operate for 4-15 GHz, the wavelength of the emitted electromagnetic radiation is 100 mm-25 mm. In this case, lambda=25 mm (corresponding to the highest frequency of 12 GHz). The use of high dielectric constant substrate will also reduce the wavelength in the antenna substrate by a factor of the effective reflective index between substrate and air sqrt(3.66+1), so wavelength=25/sqrt(1+3.66)=16.4 mm The dipole antenna length (from tip to tip in the y direction) should be less than lambda/2 in the medium or 8.2 mm (16.4 mm/2) or less. The dx and dy dimensions of the unit cell 100a should also be equal to or less than lambda/2, or 7.5 mm or less in this example.

The lengths Lc1 and Lc2 of each of the conductors 20a and 20b are also preferably less than lambda/2 (e.g., less than the dipole antenna length) and more preferably less than lambda/4 (e.g., less than half of the dipole antenna length, or less than the length of a radiation arm 10a or 10b of the dipole antenna 10). In this example, conductors 20a and 20b are each 0.3 mm or less. By keeping conductors 20a and 20b short in total length (e.g., less than half of the dipole antenna 10 length, or less than the length of a radiation arm 10a or 10b of the dipole antenna 10), conductors 20a and 20b may provide the driving current to the radiating arms 10a and 10b of the dipole antenna 10 without causing problems that might otherwise result from electromagnetic radiation being emitted from conductors 20a and 20b. Thus, the anode and the cathode of the photodiode may be respectively connected to the radiating elements 10a and 10b without requiring a transmission line and the resulting signal imbalance resulting from use of a transmission line. Thus, baluns may not be necessary, providing a significant reduction in cost, size and complexity.

Anode bias line 22a (e.g., conductive wire) extends in the x direction of FIG. 1 within and/or on a bottom surface of the substrate 12. Anode bias line 22a is electrically connected to radiating arm 10a of unit cell 100a by a conductive via $22a_1$ at least partially extending through the substrate 12 to connect to a bottom surface of the radiating arm 10a. Cathode bias line 22b (e.g., conductive wire) is spaced apart from the anode bias line 22a, and extends in the x direction of FIG. 1 within and/or on a bottom surface of the substrate 12. Cathode bias line 22b is electrically connected to radiating arm 10b of unit cell 100a by a conductive via $22b_1$ at least partially extending through the substrate 12 to connect to a bottom surface of the radiating arm 10b.

Each of the anode bias line 22a and the cathode bias line 22b may be made sufficiently thin so that the bias lines 22a and 22b have a much higher impedance than the radiating arms 10a and 10b of the dipole antenna 10. Thus, radiation from these bias lines 22a and 22b may only start to be problematic at a frequency much higher than the operating frequency of the dipole antennas 10. For instance, if the antenna is designed at 5-20 GHz, the radiation from two bias lines 22a and 22b may only start to occur at frequencies of 25 GHz or greater. So the presence of the bias lines 22a and 22b do not have significant impact on the dipole antenna radiation over the interested frequency band. However, in designs where the operating frequencies of the dipole antenna 10 may be in a range where the anode bias line 22a and cathode bias line 22b start to radiate (e.g., at 25 GHz or greater in the above example), the bias lines 22a and 22b may be shielded, such as by the ground plane 18. In addition or in the alternative, a first inductor may be connected between the anode bias line 22a and the anode of the photodetector 14, and a second inductor may be connected between the cathode bias line 22b and the cathode of the photodetector 14. The first and second inductors may act as RF chokes to provide remove filter the RF signal from the DC signal so that only the DC signals (e.g., ground or Vbias) are provided to the photodetector 14.

Anode bias line 22a extends across the array of dipole antennas 10 of the TCA 100 to connect the radiating arms 10a of antennas 10 that are aligned in a row in the x direction. See the example of FIG. 3E, e.g. Cathode bias line 22b extends across the array of dipole antennas 10 of the TCA 100 to connect the radiating arms 10b of antennas 10 that are aligned in a row in the x direction. The anode bias line 22a is connected to ground or other reference DC voltage. The cathode bias line 22b is connected to voltage source to provide a DC bias voltage Vbias. Together, the anode bias line 22a and cathode bias line 22b apply a reverse bias voltage across the photodiode 14 of the unit cell 100a to which they are connected (along with all other photodiodes of the unit cells 100a of the TCA 100 to which they are connected). Specifically, a ground voltage (potential) is applied to the anode of photodiode 14 due to the electrical connection of the photodiode anode to the anode bias line 22a through conductor 20a and radiating element 10a. The DC bias voltage Vbias is applied to the cathode of photodiode 14 due to the electrical connection of the photodiode cathode to cathode bias line 22b through conductor 20b and radiating element 10b.

FIG. 3C illustrates a resistor 30, a ceramic ferrule 32, a spacer 34 and submount 38 may be included as part of the unit cell 100a. Resistor 30 may be connected between radiating arms 10a and 10b. In this example, the resistor is a chip resistor directly mounted on the upper surface of the radiating arms 10 and 10b. Ceramic ferrule 32 houses a length of optical fiber 36 at its end 36a and is attached to a transparent submount 38 at 32a (see FIG. 3B). Submount 38 may be quartz chip, e.g. Spacer 34 may be sandwiched between the submount 38 and the bottom surface of the substrate 12 and include an opening therein in which photodiode 14 is positioned. The spacer 34 may be integral as shown or be formed of discontinuous separate elements (such as pillars positioned at each the four corners of the submount 38. Photodiode 14 is mounted to the bottom surface of substrate 12 at a location between the spacer 38 and substrate 12 to receive light emitted from the end 36a of the optical fiber 36. The transmitted by the optical fiber 36 and detected by photodetector 14 may be infrared, such as near infrared, but other light may be used as well. A lens (not shown) may also be positioned between the photodiode and the end 6a of optical fiber 36 (or be made part of photodiode chip packaging) to focus light emitted from the end 36a of the optical fiber 36 onto the PIN junction of the photodiode 14.

Figure 3F:
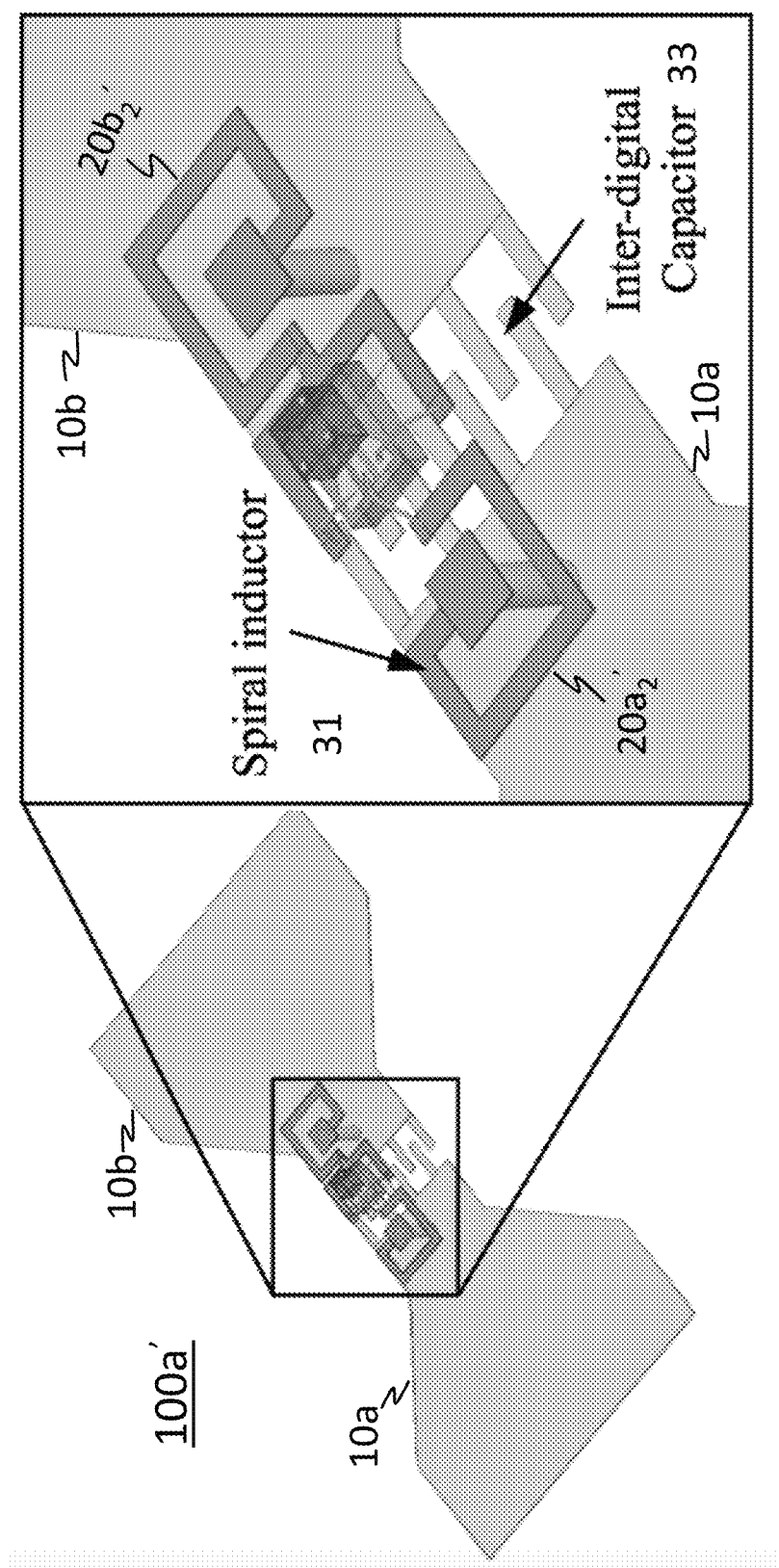
FIG. 3F is a perspective view of portions of an alternative unit cell.

FIG. 3F is a perspective view of portions of an alternative unit cell 100a' with ground plane 18 and substrate 12 removed except for certain wiring of the substrate 12. Unit cell 100a' may comprise the same structure as unit cell 100a described herein and be implemented in TCA array 100 in the same manner as described herein with respect to unit cell 100a. As shown in FIG. 3F, wiring layer 20a2' of substrate 12 and wiring layer 20b2' may be formed in a spiral in order to form an inductor 31 as part of the conductor 20a and 20b respectively. Further, an interdigital capacitor 33 may be formed to connect radiating arms 10a and 10b. As shown in FIG. 3F, electrodes of the interdigital capacitor 30 may be formed from the same metal layer on the top surface of substrate 12 forming radiating arms 10a and 10b, and integrally formed with the respective radiating arm 10a, 10b. Remaining portions of unit cell 100a' may be the same as that disclosed with respect to unit cell 100a.

Figure 4A:
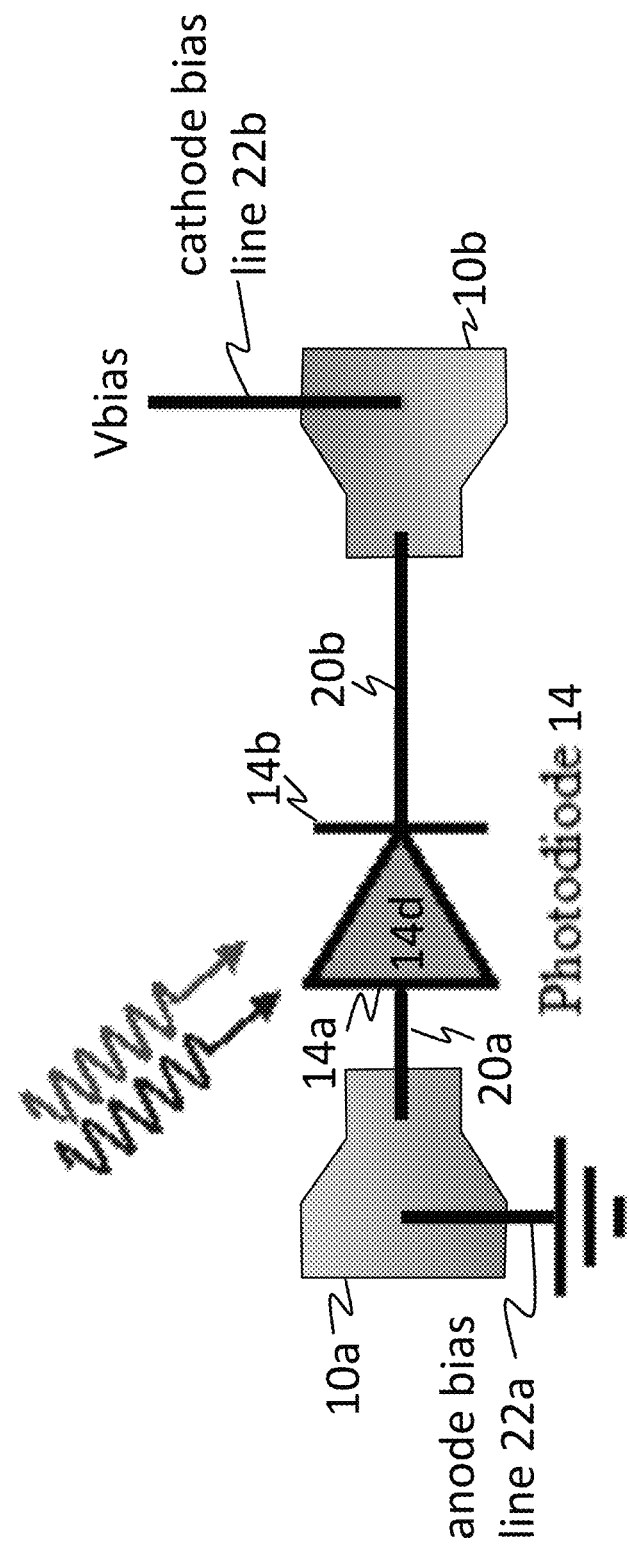
FIG. 4A is a schematic diagram illustrating electrical connections of a photodiode 14 antenna radiating arms.

FIG. 4A is a schematic diagram illustrating electrical connections of the photodiode 14 to the antenna radiating arms 10a and 10b and anode bias lines 22a and 22b of the unit cell 100a. As shown, a ground bias is applied to the anode 14a of photodiode 14 due to the electrical connection of the anode 14a to anode bias line 22a through the radiating arm 10a. Similarly, a positive bias voltage Vbias is applied to the cathode 14b of the photodiode 14 due to the electrical connection of the cathode 14b to the cathode bias line 22b through the radiating arm 10b.

Figure 4B:
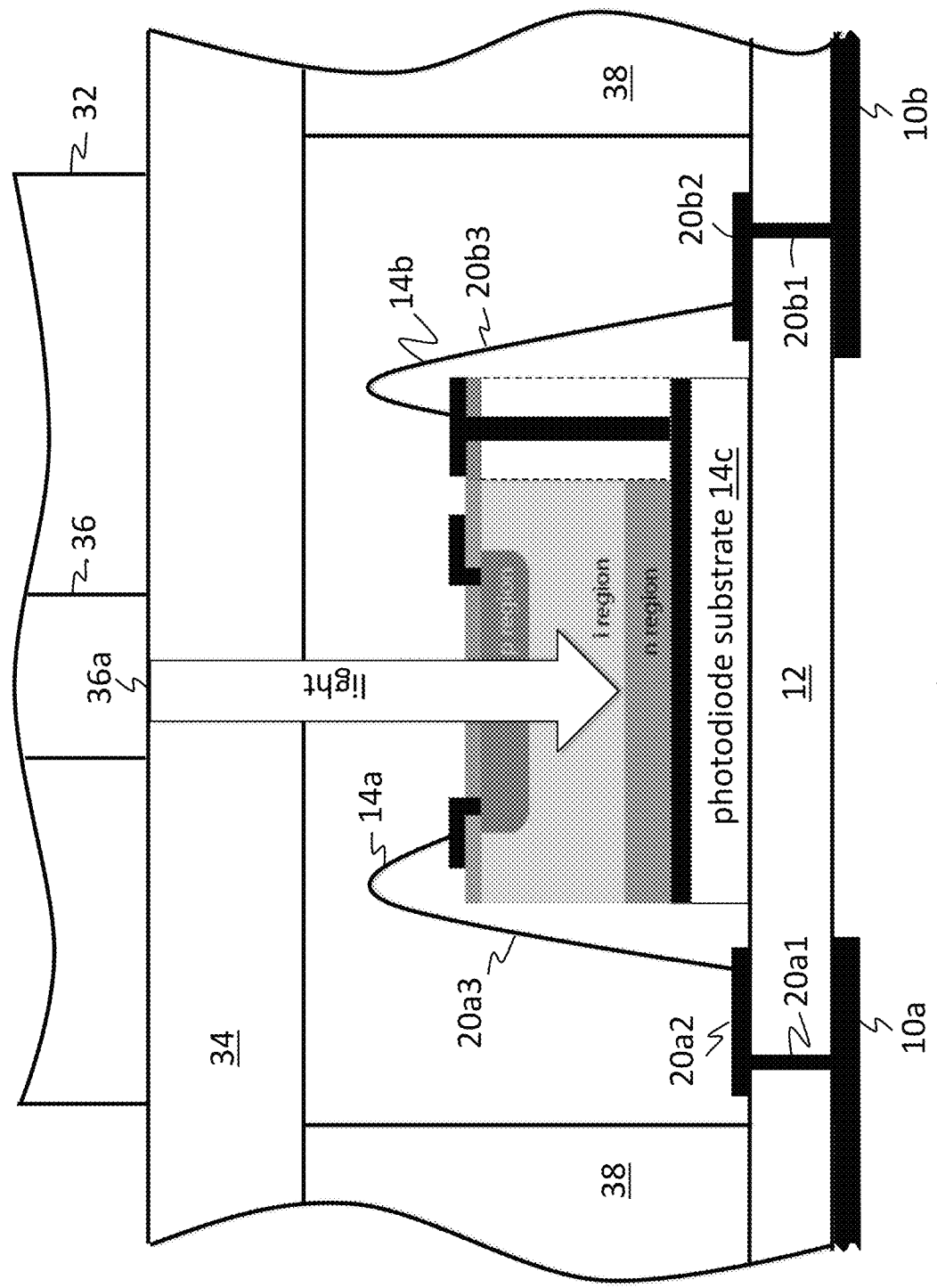
FIG. 4B is a simplified cross sectional view of the photodiode and related structure.

FIG. 4B is a simplified cross sectional view of the photodiode 14 and a simplified representation of electrical connections between the photodiode 14 and the antenna 10 and the structure of the unit cell 100a adjacent the photodiode 14. Photodiode 14 may comprise a PIN diode 14d formed of a p-doped region, an intrinsic region and an n-doped region of one or more semiconductor materials. The PIN diode 14d may be formed on a substrate 14c of the photodiode 14 which is mounted to the lower surface of substrate 12 (shown to be the upper surface in FIG. 4B). A wire 20a3 may connect anode 14a to a wiring layer 20a2 of substrate 12, which in turn is connected by conductive via 20a1 to radiating arm 10a. Wire 20a3, wiring layer 20a2 and conductive via 20a1 may comprise conductor 20a and have a length less than the dipole antenna length 10 or less than a length of the radiating arm 10a or 10b as described herein. A wire 20b3 may connect cathode 14b to a wiring layer 20b2 of substrate 12 which in turn is connected by conductive via 20b1 to radiating arm 10b. Wire 20b3, wiring layer 20b2 and conductive via 20b1 may comprise conductor 20ab and have a length less than the dipole antenna length 10 or less than a length of the radiating arm 10a or 10b as described herein. FIG. 4B also illustrates optical fiber 36 housed by ferrule 32 connected to spacer 34 above photodiode 14. End 36a of optical fiber 36 is positioned to emit light to impinge on the PIN diode 14d of photodiode 14.

As shown in FIG. 4B, the photodetector 14 is positioned between the radiating elements 10a and 10b allow for short lengths of conductors 20a and 20b. Further, a vertical distance between the electrodes (anode 14a, cathode 14b) of the photodiode 14 and the radiating arms 10a and 10b is made small to minimize a parasitic capacitance resulting therefrom. In this example, the vertical distance is substantially equal to the height of the photodiode package and the width of substrate 12. Thus the vertical distance may be made smaller than about 7 mm with conventional PCB substrates (e.g. about 1.5 mm or less, or 0.8 mm or less, or 0.4 mm or less in thickness) and conventional LED packages (e.g., less than 5 mm in height). However, if a flip-chip mounting of the LED package is utilized, the vertical distance between the photodiode electrodes and the radiating elements 10a and 10b substantially correspond to the thickness of the substrate 12 and thus may be even smaller than 7 mm, such as about 1.5 mm or less, or 0.8 mm or less, or 0.4 mm or less, depending on the PCB substrate of the system.

As shown in FIG. 4B, a direct electrical connection is formed between the antenna radiating arm 10a and the anode 14a of photodiode 14 and a direct electrical connection is formed between antenna radiating arm 10b and the cathode 14b of the photodiode 14. No amplifier or logic gates need be used to drive the radiating arms 10a and 10b by the photodiode 14. Further, a single-ended electrical connection (rather than a differential electrical connection) may be used to connect the electrodes 14a, 14b of the photodiode 14 to a respective one of the radiating arms 10a, 10b. Thus, an imbalance in the driving of the radiating arms 10a and 10b may be avoided and the use of baluns or other complex, bulky circuitry may be avoided.

Figure 5:
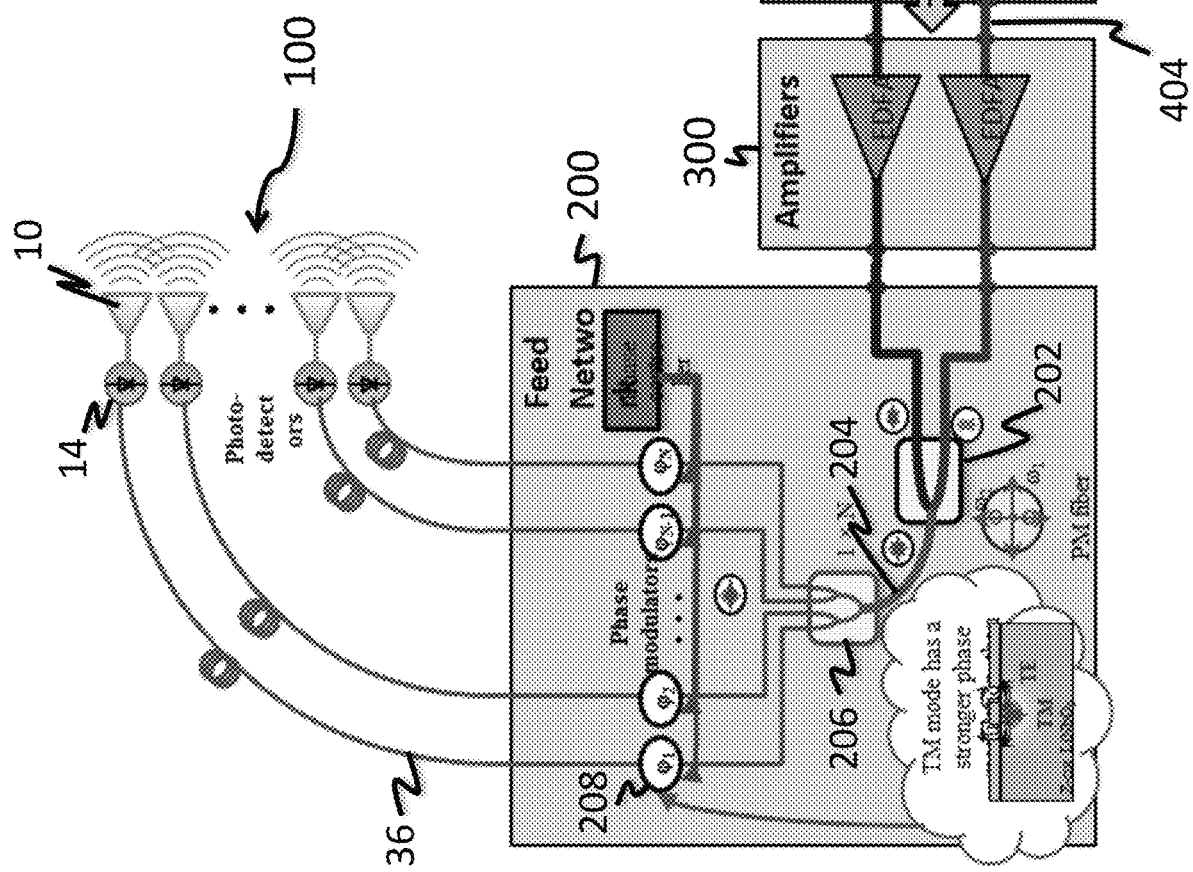
FIG. 5 is a system diagram of the transmitting phased array.

FIG. 5 is a system diagram of the transmitting phased array 1000 several different functional subsystems, i.e., tunable optical paired sources 500, data modulators 400, high-power Erbium doped fiber amplifiers 300, optical feed network 200, and tightly coupled phased array 100.

Paired of optical sources are phase locked to each other through a common seeding laser, as shown in TOPS unit 500. Three lasers are used in the system. A master laser is electrically modulated with a high-speed EO modulator by a comb of RF harmonics produced by a saturated RF amplifier from an RF local oscillator. The resultant upper and lower optical sidebands can be injected into two slave lasers to produce two injection locked lasing signals. By intentionally tuning the optical wavelengths of two slave lasers #1 and #2 to the upper and lower sidebands, respectively, the resultant locked laser signals can be mixed at the photodetector 14 to generate a pure RF tone. Compared with two-laser injection scheme, a doubled RF can be achieved in this three-laser scheme, which simplifies generation of a high RF frequency and provides symmetric implementation of two optical paths. As illustrated in the FIG. 5, the paired optical sources are named as an optical source (502) and an optical local oscillator (optical LO) (504).

In the data modulation unit 400, one of the paired optical sources 504 is be modulated with a QPSK (single sideband) EO modulator 402 by I and Q signals delivered from an arbitrary waveform generator (AWG) in this example for testing. However, it will be apparent that the waveform generator may typically be implemented with different QAM signals, i.e., 4 QAM and 16QAM or higher QAM, and with different modulation rates, such as 2 Mbps, 5 Mbps, 10 Mbps, 20 Mbps, 50 Mbps, 100 Mbps or higher bit rates. With additional software package, RFXpress, the AWG offers many different waveforms, i.e., QAM signals and pulsed signals, with their intermedium frequency (IF) up to 12 GHz. Using the QPSK modulator 402, a single sideband 404 can be realized.

After the data modulation by modulator 402, both optical signals 502, 404 are amplified by Erbium doped fiber amplifiers (EDFAs) 300 and combined orthogonally with optical combiner 202 into a polarizing maintaining (PM)

fiber 204. Then an optical splitter 206 is followed to produce an array of N channels. Each channel is fed into an EO modulator 208 to generate a net phase between two optical signals. For each of the N channels, orthogonally polarized beams are then projected into the same polarization and transmitted by optical fiber 36 to finally arrive at and be projected onto the photodetector 14 of the tightly coupled antenna array 100 for RF radiation. The array 100 may be the TCA 100 described above with respect to FIGS. 1-4B. In other examples, the array of system 1000 may be a different antenna array, such as the alternatives described herein.

Each photodiode 14 in the array 100 acts as a driving source and can be represented by an ideal current source $I_{ph}$ in parallel with a capacitance $C_{pd}$. In this case, $I_{ph}$ is a photocurrent generated by photomixing two optical signals with optical power of $P_{opt1}$ and $P_{opt2}$, frequency of $f_{opt1}$ and $f_{opt2}$, phase of $\phi_{opt1}$ and $\phi_{opt2}$, respectively. $I_{pd}(f_{RF})$ can be expressed as:

$$I_{pd}(f_{RF}) = \Re\sqrt{2P_{opt1}P_{opt2}}\xi(f_{RF})e^{j(2\pi f_{RF}t+\phi_{RF})}, \quad (1)$$

where $f_{RF}$ and $b_{RF}$ are frequency and phase of the generated RF current, $f_{RF}=f_{opt1}-f_{opt2}$, $\phi_{RF}=\phi_{opt1}-\phi_{opt2}$, $\Re$ is the responsivity of the photodiode, and $\xi(f_{RF})$ is the frequency response of the photodiode. The capacitance $C_{pd}$ can be extracted from the frequency response as $C_{pd}=1/(100\pi B_{pd})$, where $B_{pd}=f_{3\text{-}dB}=1/2\pi RC$ is the 3-dB corner frequency when a photodiode is loaded by a 50-Ω load, R.

In this exemplary implementation of a photodiode-coupled TCA antenna, each unit cell in the array acts as a dynamic load on each photodiode. Consider a 2D infinite array under uniform amplitude and linear phase excitation. For such an infinite array, periodic boundary conditions can be applied to a single unit cell to sufficiently represent the entire array. An infinite array is a good approximation if a sufficiently large array is considered, i.e., over 10×10.

Figure 6A:
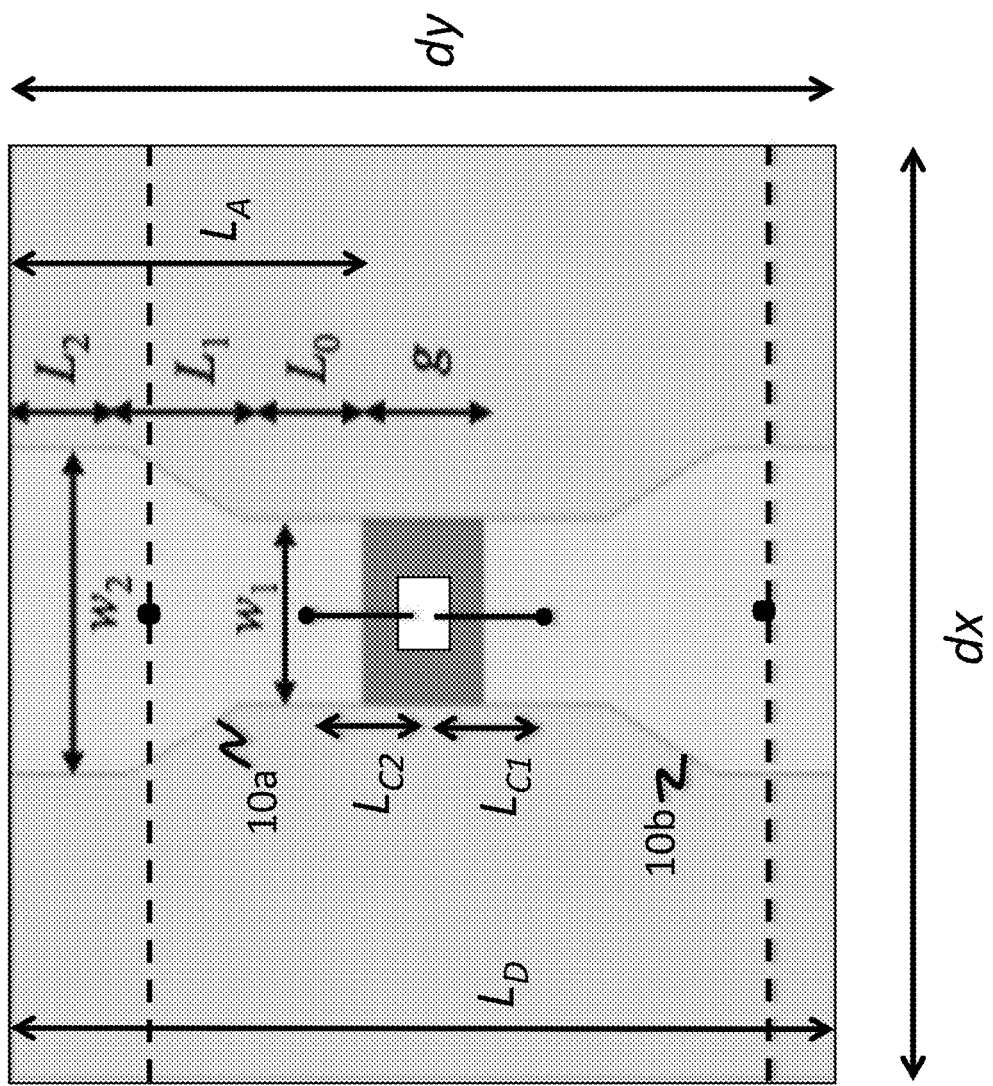
FIG. 6A illustrates a top-down view of the TCA model.

A top-down view of the TCA model is shown in FIG. 6A, in which periodic boundary conditions (PBC) are used to truncate four walls of the unit cell, and $w_1=1.4$ mm, $w_2=2.5$ mm, $L_0=1.50$ mm, $L_1=1$ mm, $L_2=1$ mm, and $g=1.04$ mm. Linear phases can be applied in both directions to provide the phase differences between two adjacent periodic boundaries to simulate beam steering. Absorbing boundary conditions (ABC) are used to terminate the unit cell in the direction perpendicular to the array. The lumped port with different source impedances, provided in the commercial electromagnetic modeling software package High Frequency Surface Simulation (HFSS) by Ansys was employed in subsequent analyses. Active impedance of a TCA can be simulated over a frequency band from 1 to 18 GHz.

Figure 6B:
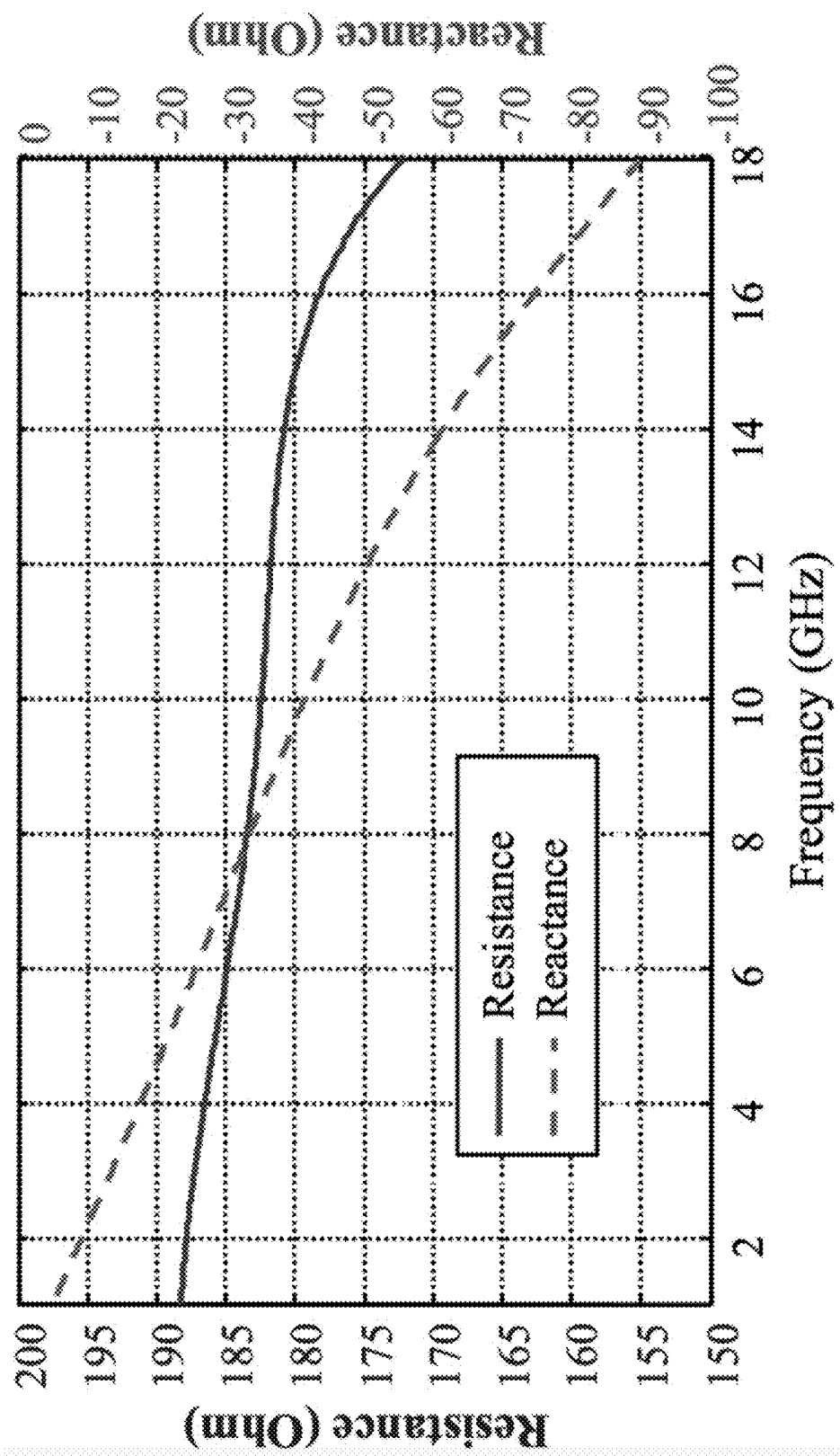
FIG. 6B is a graph of simulation results showing resistance and reactance plotted versus frequency for the connected dipole array.
Figure 6C:
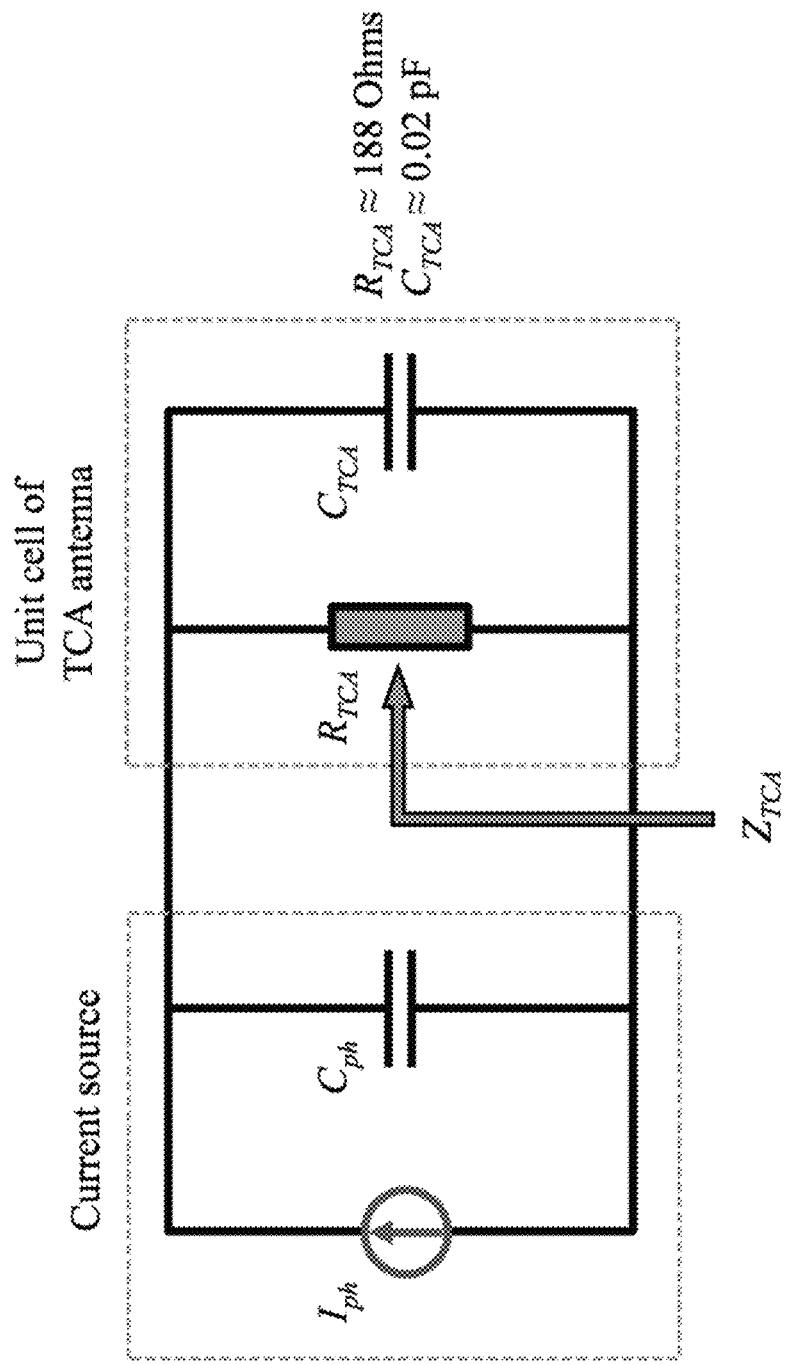
FIG. 6C is a schematic diagram of an equivalent circuit model of a photodiode-coupled TCA antenna.

FIG. 6B shows the simulated active resistance as a function of frequency. The resistance obtained from the lumped-port excitation only slightly decreases from 188 Ω to 170 Ω as the frequency increases. The simulated reactance, also shown in FIG. 6B, indicates that the TCA antenna is capacitive over the interested frequency band, and its capacitance can be extracted. Therefore, it is sufficient to represent a TCA by a circuit as shown in the right dashed box in FIG. 6C over an ultra-wide bandwidth. The equivalent circuit is comprised of a resistance of $R_{TCA}=188\Omega$ in parallel with a capacitance of $C_{TCA}=0.02$ pF. $R_{TCA}$ comprises a radiation resistance (equivalent resistance) of the dipole antenna (e.g., the resistive load of the antenna when driving the radiating arms of the antenna). Combining this equivalent circuit with the equivalent circuit of the photodiode gives a complete equivalent circuit of a photodiode-coupled TCA as shown in FIG. 6C.

Using the circuit model of a photodiode-coupled TCA system, performance can be evaluated in terms of bandwidth, and power efficiency. Referring to the schematic of a photodiode-coupled antenna with bias circuitry of FIG. 4A, voltage $V_{bias}$ provides the photodiode with a reversed bias which, in some examples, may be through an inductor serving as an RF choke. When the two-tone optical signal is incident on the photodiode, the radiated RF power of the TCA element driven by the generated RF current Ipd at the photodiode can be expressed as $$P_r(f_{RF}) = \frac{I_{pd}^2 R_{TCA}}{1 + [2\pi f_{RF} R_{TCA}(C_{pd} + C_{TCA})]^2} \quad (2)$$

As the operational frequency tends to DC, the maximum radiated power can be approximated as $P_{rmax}=I_{pd}^2 R_{TCA}$.

On the other hand, the operational bandwidth (BW) of the photodiode-coupled antenna is defined as a frequency range measured from DC to a cutoff frequency of $f_c$, where the radiation power response rolls off by 3 dB, given by, $$BW @ f_c = \frac{1}{2\pi R_{TCA}(C_{pd} + C_{TCA})} \quad (3)$$

From Eqs. (2) and (3), we can observe a trade-off between the radiated power and the operational bandwidth. Although high antenna impedance to the photodiode will increase radiation power, it also will decrease the system bandwidth. From Eq. (3), it will be appreciated that the bandwidth is inversely proportional to the total capacitance, including photodiode and antenna capacitance. Taking these into account, we introduce the bandwidth (BW) and maximum radiation power product ($P_{rmax}$) per square photocurrent ($I_{pd}$) as a figure of merit to evaluate a photodiode-coupled TCA antenna, $$BW \cdot \frac{P_{rmax}}{I_{pd}^2} = \frac{1}{2\pi(C_{pd} + C_{TCA})} \quad (4)$$

It is noted that this figure is only determined by the capacitance of a photodiode and TCA. Additionally, from an information theory point of view, Eq. (4) describes an information capacity at a transmit side of a communication system.

Power efficiency is another parameter used to evaluate a photodiode-coupled TCA. It is defined as the ratio of the radiated power, $P_r$, to total power consumption including total incident optical power, $P_{opt1}$ and $P_{opt2}$, and the DC power dissipated in the photodiode, $P_{dc}$. Thus, power efficiency η can be expressed as, $$\eta(f) = \frac{P_r(f)}{P_{opt1} + P_{opt2} + P_{dc}} \quad (5)$$

in which $P_{dc}$ can be determined by the product of the bias voltage and the generated DC photocurrent. From Eqs. (1) and (2), the radiated power can be expressed as, $$P_r(f_{RF}) = \frac{2\xi^2(f_{RF})\Re^2 P_{opt1} P_{opt2} R_{TCA}}{1 + [2\pi f_{RF} R_{TCA}(C_{pd} + C_{TCA})]^2} \quad (6)$$

The maximal radiated power can be achieved when each tone of the two-tone signal has equal optical power, i.e., $P_{opt1}=P_{opt2}=P_{opt}$. To ensure linear operation, the photodiode should have a minimal bias voltage of $V_{bias,min} \approx \sqrt{2I_{pd}R_{TCA}}$, resulting in the minimal consumed DC power to approximately be $P_{dc} \approx 2\sqrt{2}\Re P_{opt} I_{pd} R_{TCA}$. As a result, the power efficiency can be derived as $$\eta(f_{RF}) \approx \frac{\Re^2 \xi^2(f_{RF}) P_{opt} R_{TCA}}{1 + 2\Re^2 \xi^2(f_{RF}) P_{opt} R_{TCA}} \quad (7)$$

From Eq. (7), power efficiency increases with increasing $P_{opt}$, $\Re$, and, $R_{TCA}$, asymptotically approaching the theoretical limit equal to 0.5.

To demonstrate ultra-wideband operation in a conformal phased array, a TCA was designed on a 20-mil Rogers 4350 substrate with a dielectric constant of 3.66, integrated with an array of photodiodes. The photodiode specifications used in the simulation were taken from a commercial component of Albis Optoelectronics, Product Name PDCS24L, which has a 20-GHz 3-dB bandwidth. The photodiode is fabricated on a 4-mil InGaAs/InP substrate with a dielectric constant of 12.9 and flip-chip bonded on a 4-mil ceramic submount with a dielectric constant of 9.8. A lens is integrated on the backside of the photodiode chip to couple and focus the incident light on the active area of the photodiode.

Based on the previous discussion, the operational bandwidth of a photodiode-coupled transmitting antenna is strongly dependent on $R_{TCA}(C_{ph}+C_{TCA})$: the higher the photodiode and TCA capacitances and larger the antenna radiation resistance, the more narrow the operational bandwidth. To minimize the contribution to the bandwidth limitation arising from the photodiode, a high-speed photodiode with a lower junction capacitance is preferred. Alternatively, as shown in FIG. 6C, the conventional TCA model suggests that a TCA can be approximated as a circuit that has a resistance impedance of $R_{TCA} \sim 188\Omega$ and a capacitance of $C_{TCA}$ over the interested frequency bandwidth. A high value of $R_{TCA}$ may cause significant degradation in the operational bandwidth. To mitigate this issue, various techniques are explored to minimize TCA capacitance $C_{TCA}$ and resistance $R_{TCA}$. A parametric study has been performed as part of the TCA analysis to obtain an optimal configuration, and $C_{TCA}$ was found to be about 0.02 pF which was much smaller than that of the photodiode capacitance. This supports the conclusion that the capacitance of the TCA is not a significant factor in determining the operational bandwidth. In fact, the parasitic capacitances induced from various components in the integration of the photodiode to the TCA were found to be dominant in the total capacitance.

A photodiode-coupled TCA described herein has the photodiode integrated with its radiating element and feeding optical fiber. The integration process introduces parasitic reactance leading to degradation from an ideal operational bandwidth. Several sources of parasitic reactance can be identified. First, when the photodiode is attached to the TCA antenna, the height mismatch between the antenna substrate and the photodiode can produce parasitic capacitance. Second, flip-chip or wire bonding of the photodiode electrodes (anode, cathode), if applicable, can produce parasitic inductance. Third, the dielectric components, i.e., optical fiber ferrules, can produce parasitic reactance as well. Hence, the impact of an integration process should be taken into account in a full-wave modeling in order to obtain accurate design performance.

Figure 7A:
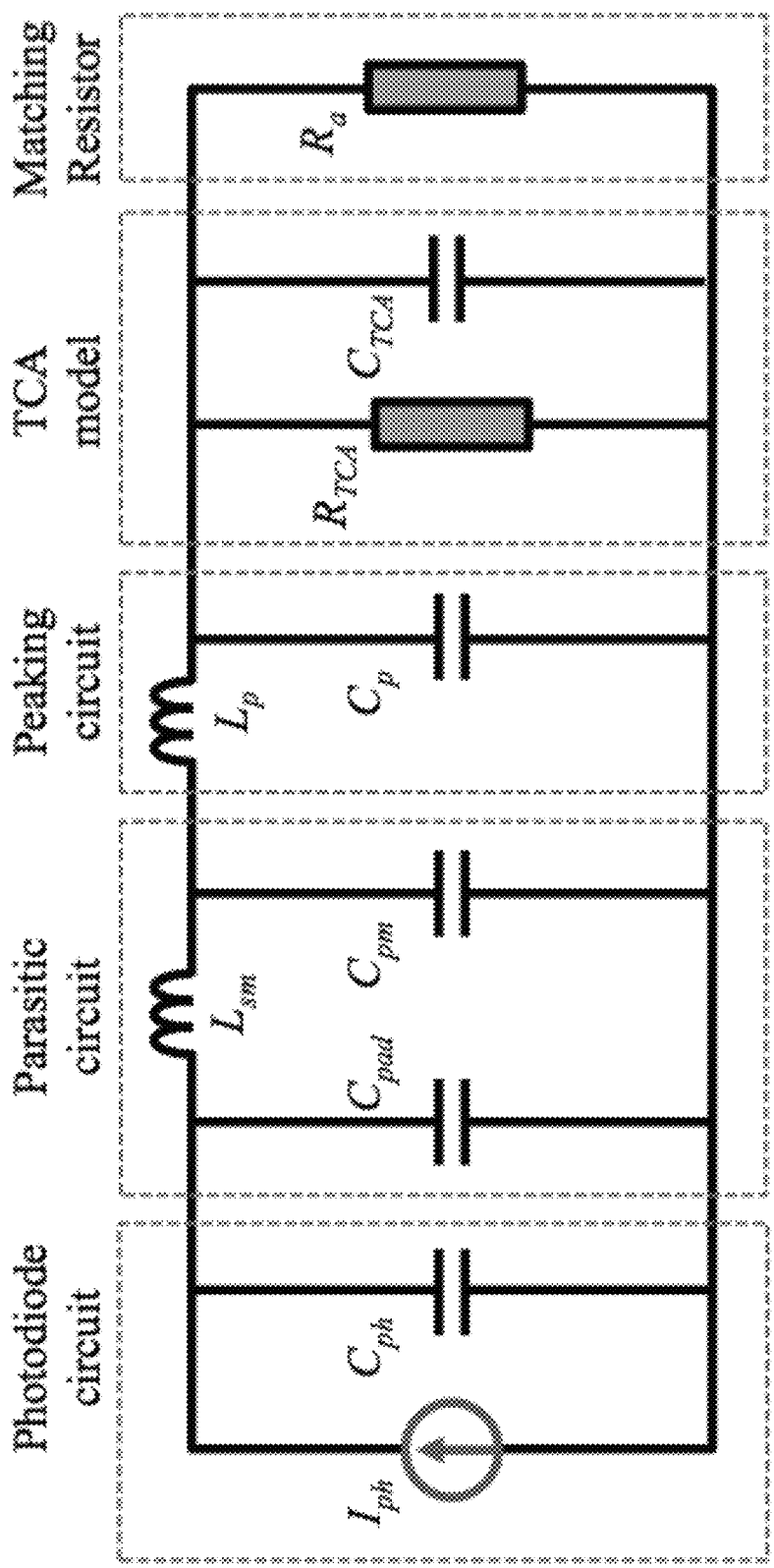
FIG. 7A illustrates a simplified circuit model of a unit cell.

A full-wave HFSS-simulation model of a unit cell 100a of FIGS. 3A-3D of the photodiode-coupled TCA 100 of FIG. 1 was built. As previously described, integration components include ferrule 32 and spacer 34, and photodiode 14 being disposed on a bottom surface of substrate 12, and shows dipole antenna radiating arms 10a and 10b, and high frequency resistor 30 being disposed on an upper surface of substrate 12 and electrically connected in parallel with photodiode 14. The model incorporates diverse components for integration, including submount 38 for the photodiode 50, inductive wires for bias lines 22a and 22b, and capacitors 40 for bandwidth enhancement. FIG. 7A shows a simplified circuit model of a unit cell 100a, consisting of a photodiode circuit, parasitic circuit 59b to account for integration, peaking circuit, TCA model, and matching resistor.

Figure 7B:
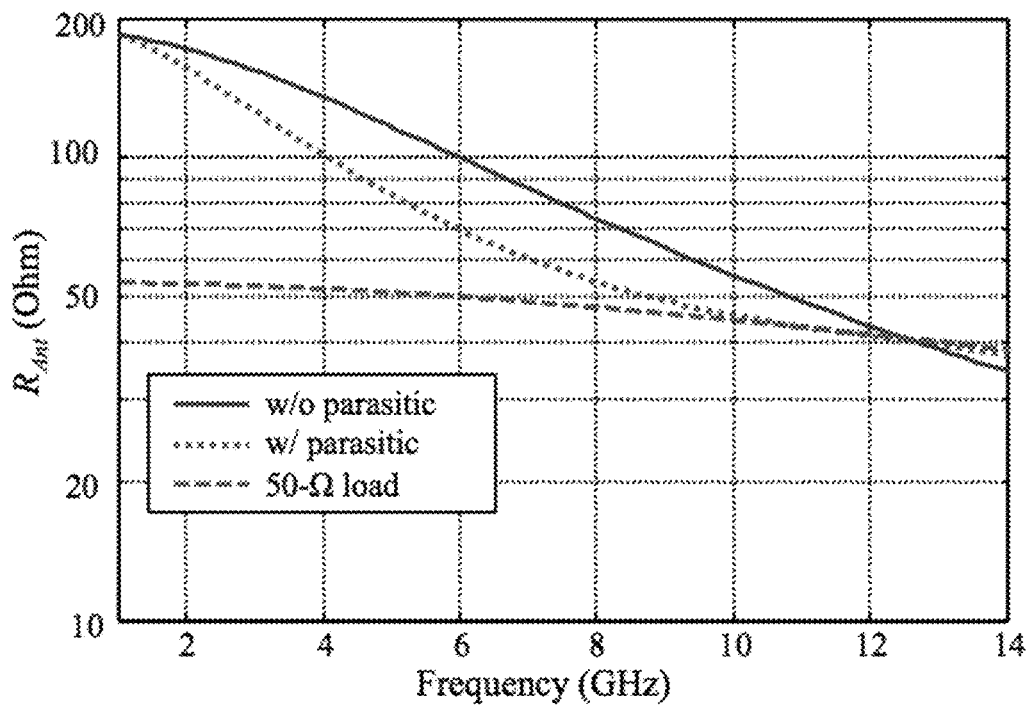
FIGS. 7B and 7C illustrate antenna active impedance, including resistance and reactance, as a function of frequency.

As described previously with respect to FIGS. 3A-3D, photodiode 14 may be directly integrated to substrate 14, which may be a dual layer substrate or printed circuit board PCB such as a Rogers high-frequency substrate. The antenna radiating arms 10a and 10b are formed on the top of the substrate 12, and a photodiode 14 is mounted on the bottom surface of the substrate 12. Micro-vias 20a1, 20b1, substrate wiring 20a2, 20b2 (including bonding pads), and bonding wires 20a3, 20b3 are used to electrically connect the antenna 10 and photodiode 14 together. Note that, in order to depict these structures more clearly, the substrate 12 is not shown in FIG. 3D. The simulated antenna active impedance, including resistance and reactance, is shown as a function of frequency in FIG. 7B. The solid and dashed curves show the simulated radiation resistance of an ideal TCA when a photodiode is terminated with 188Ω and 50Ω, respectively. With higher load impedance, the operational frequency bandwidth is reduced significantly. In addition, the result of a full wave simulation that incorporates all integration components is shown by the dotted curve in FIG. 7B and demonstrates the significant impact of parasitic components on the operational bandwidth. It is noted that the bandwidth, as indicated by the input resistance, is about 2 GHz more narrow due to the parasitic components.

Figure 7C:
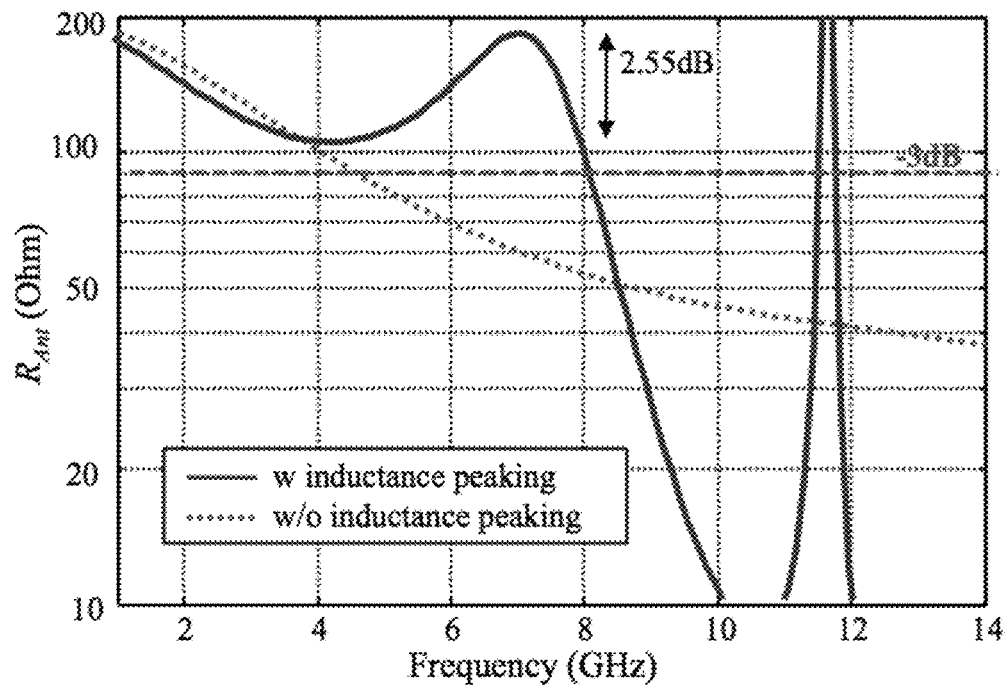

To improve the operational bandwidth, inductive peaking is employed by introducing an LC peaking circuit at the feed of the photodiode 14, as shown in the circuit model of FIG. 7A. To this end, a spiral inductor 31 and an interdigital capacitor 33 may be used as shown and described with respect to FIG. 3F, and have been added to the model of FIG. 7A. The inductance of the spiral inductor 31 is used for inductive peaking and the capacitance of the interdigital capacitor 33 is used to tune the peak frequency. An extensive parametric study was performed to optimize these structures. The frequency peaking provides two times broader bandwidth than that without inductive peaking: as shown in FIG. 7C, the TCA with inductive peaking achieves a bandwidth of 8 GHz and an in-band ripple of 2.55 dB.

Figure 8A:
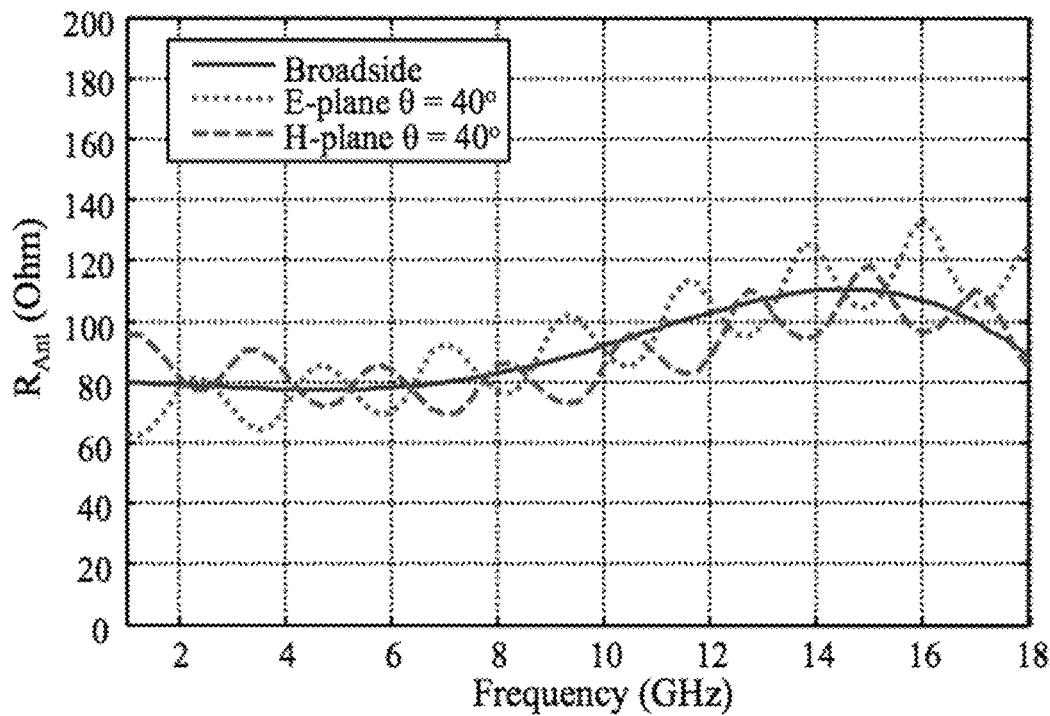
FIGS. 8A-8D are graphs of TCA input impedance at different beam steering angles and resistance or reactance with and without bias lines.
Figure 8B:
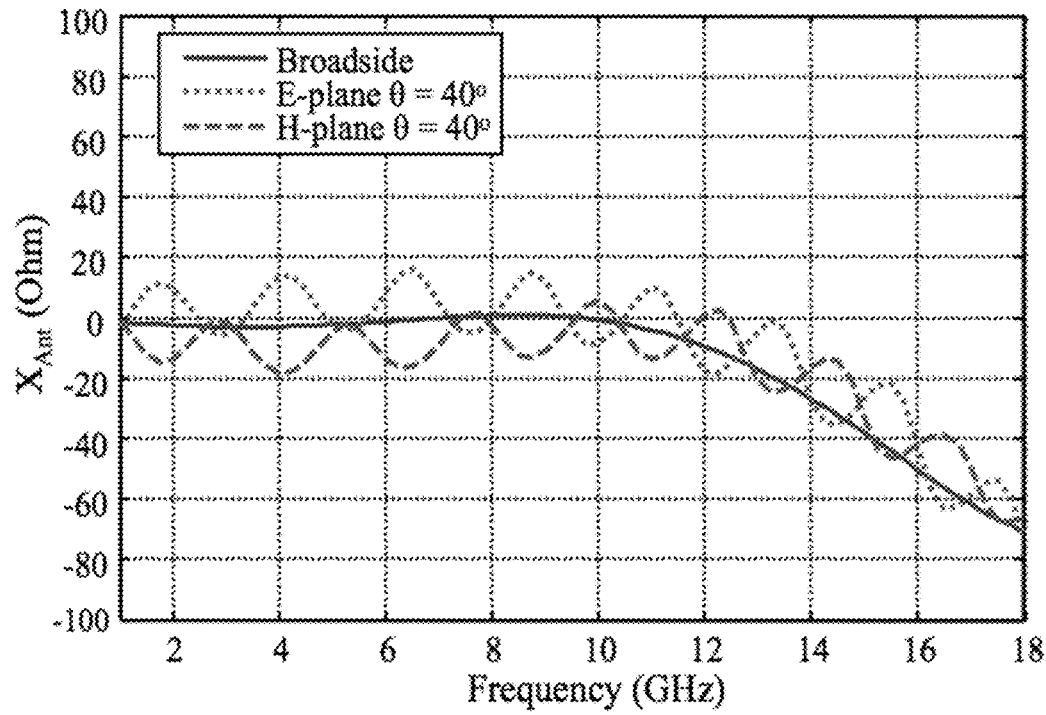
Figure 8C:
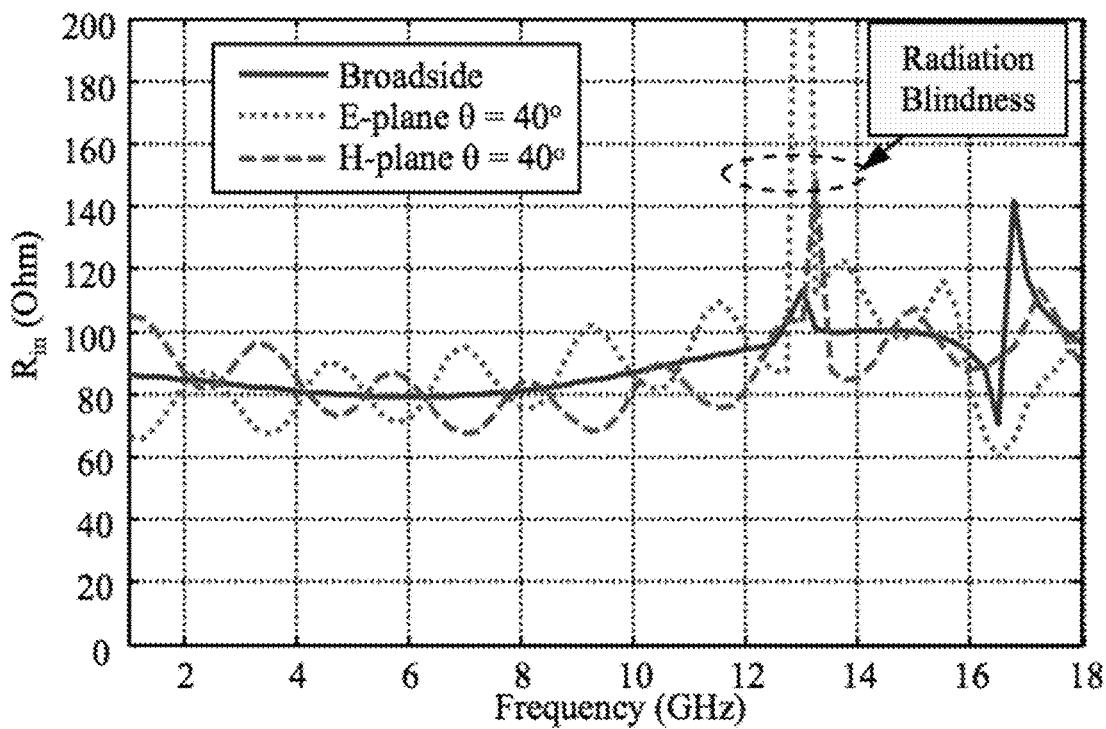
Figure 8D:
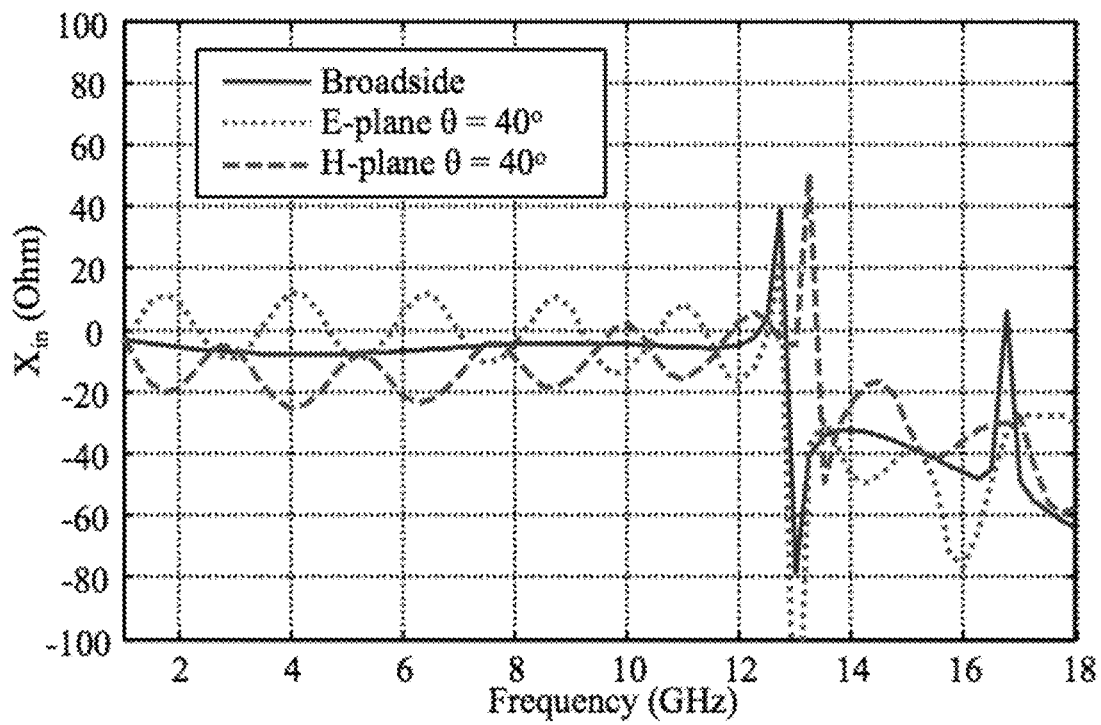

The bandwidth may be further improved by adding a high-frequency resistor to the antenna feed in parallel with the photodiode to reduce the total load impedance to the photodiode. As a result, a larger operational bandwidth can be achieved at the cost of increased insertion losses. To this end, a high-frequency $R_a$=221Ω chip resistor 30 (shown in FIG. 3C) is placed across the feed of each dipole antenna 10. In addition, a photodiode-coupled TCA 100 may use bias circuits 22a, 22b to supply all the photodiodes 14. Optimally, only DC current is allowed to flow on these bias lines 22a, 22b and zero RF current. Practically, if each radiator 10a, 10b is electrically small, bias lines 22a, 22b impose some loading effect on each radiating element of a TCA. Therefore, the bias lines were incorporated with the other parts of a TCA in the full-wave simulation. The simulation results indicate that scan blindness can occur due to bias networks. Such radiation blindness is preferred to be eliminated from the desired operational bandwidth. To this end, two features are useful in designing the bias lines 22a, 22b, in order to minimize electromagnetic coupling between the bias lines 22a, 22b and radiating arms 10a, 10b. First, the contact points to connect bias lines with each radiating arm 10a, 10b should be placed where the RF current is weak. Second, the bias lines 22a, 22b within a unit cell 100a should be shorter than half a wavelength at the highest operational frequency to mitigate potential resonance:

$$L_b < \frac{\frac{1}{2}\lambda_{min}}{\sqrt{[1/2(\varepsilon_r+1)]}},$$

wherein $L_b$ is the length of a bias line in unit cell 100a, $\lambda_{min}$ is the wavelength of the highest operational frequency, and $\varepsilon_r$ is the effective dielectric constant of the substrate. To investigate the impact of bias lines, the input active impedance of the TCA with the bias lines 22a, 22b (FIGS. 8C and 8D)) is compared with that of the same model except excluding the bias lines (FIGS. 8A and 8B)). When the frequency is below 12 GHz the bias lines seem to impose a slight impact and the input impedance exhibits several interesting properties. According to the simulation results, the input resistance slightly varies between 80Ω and 100Ω and the input reactance is close to zero. If the TCA is sufficiently large, there is no low cut-off frequency. Radiation blindness can be found in FIGS. 8C and 8D in which the bias lines are present and appear around 13 GHz (shown by the spikes in FIGS. 8C and 8D).

Beam steering may also be implemented by the TCA 100. The impedance response as a function of frequency has been simulated when the phased array is steered away from the broadside by up to 40° in the both E and H planes. The results show that the input impedance oscillates within a range of ±18Ω, or <1 dB in radiated power, demonstrating minimal impact to the radiation characteristics over the frequency band from 2 to 12 GHz. To this end, an optimized design of the TCA 100 may incorporate inductance peaking, bias control circuitry and/or parallel resistance at the feed, as well as photodiode and its integration components. This exemplary implementation's configuration has experimentally demonstrated the high performance of a photodiode-coupled TCA phased array.

Figure 9A:
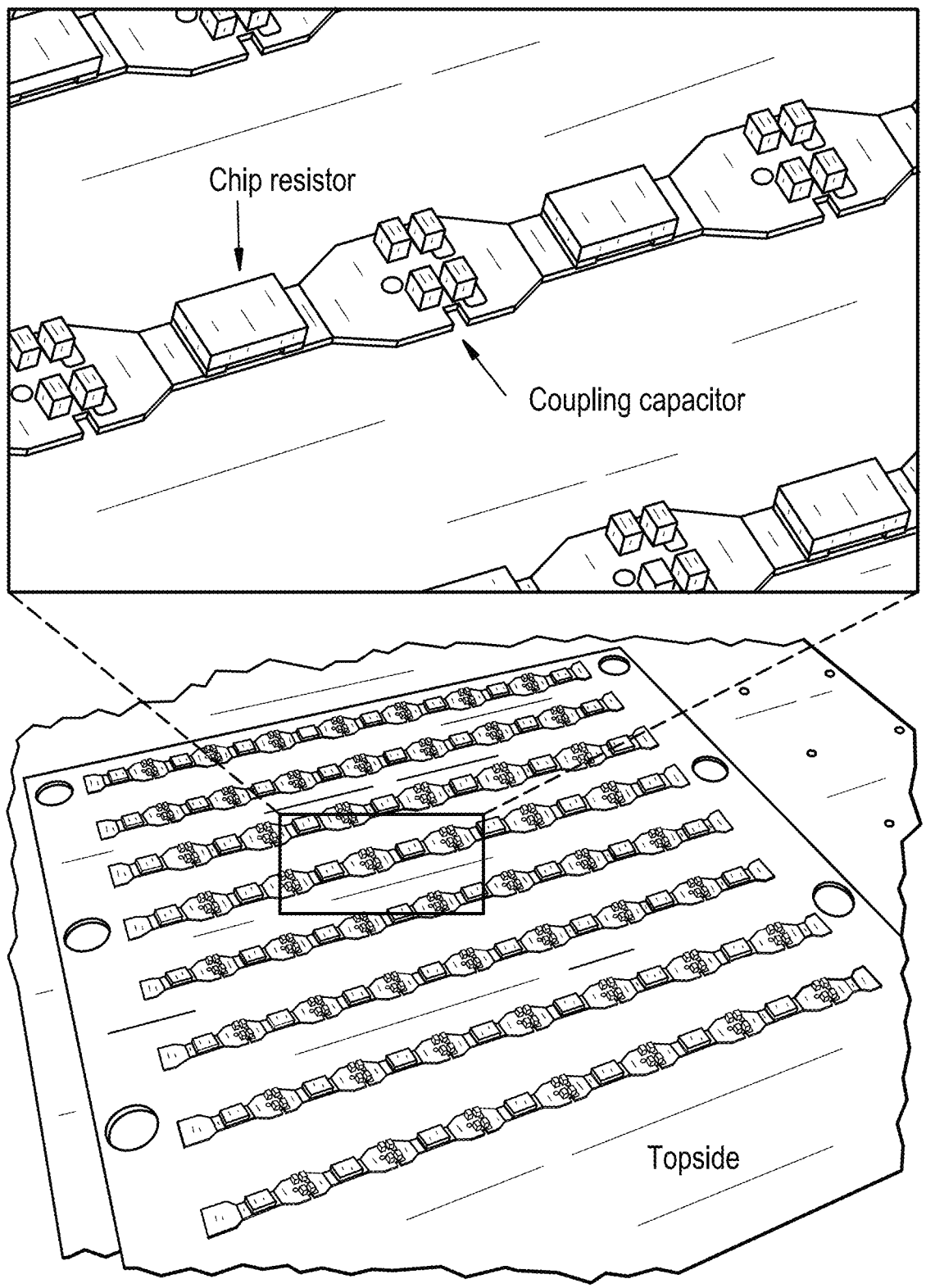
FIG. 9A shows a TCA antenna with the dipoles, 221-Ω chip resistors, and 0.1-µF wide band capacitors disposed on a surface of the superstrate.

Based on an exemplary implementation, an 8×8 tightly-coupled dipole array has been fabricated on a 20-mil Rogers 4350 high-frequency substrate using a commercial printed-circuit-board fabrication process. The details of this particular implementation are shown and described with respect to FIGS. 9A and 9B. The TCA resides on the topside of the substrate or PCB, as shown in FIG. 9A. To increase capacitive coupling, two 0.1-µF wideband (100 KHz-40 GHz) capacitors are placed in parallel across the adjacent dipoles. Large capacitance between radiating elements provides strong RF coupling, effectively shorting adjacent dipoles over an ultra-wide frequency band. As a result, the TCA can be viewed as a connected dipole array. High-frequency 221-Ω chip resistors are flip-chip bonded across the feeding point between the two arms of the dipoles, leading to the increased TCA operational bandwidth due to the reduced antenna input resistance.

Figure 9B:
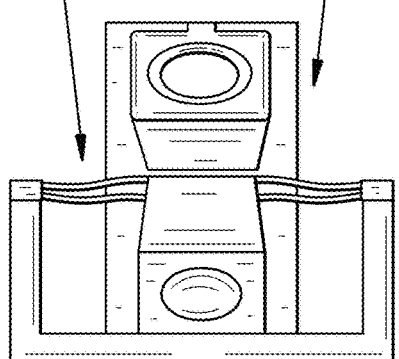
FIG. 9B shows the TCA bias network and photodiodes disposed on a different surface from the surface in FIG. 8A.
Figure 9B:
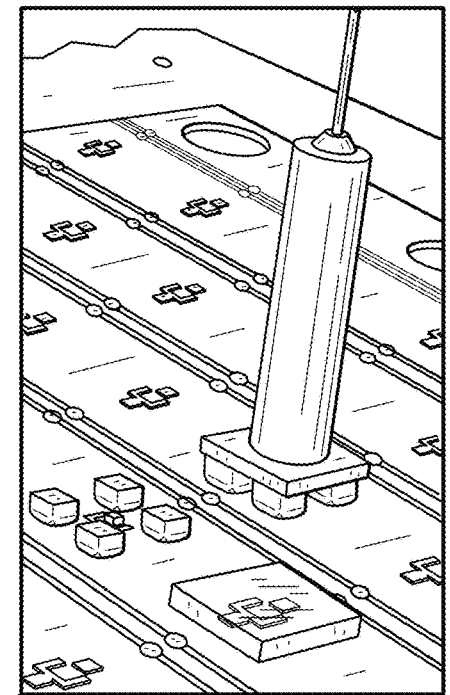
Figure 9B:
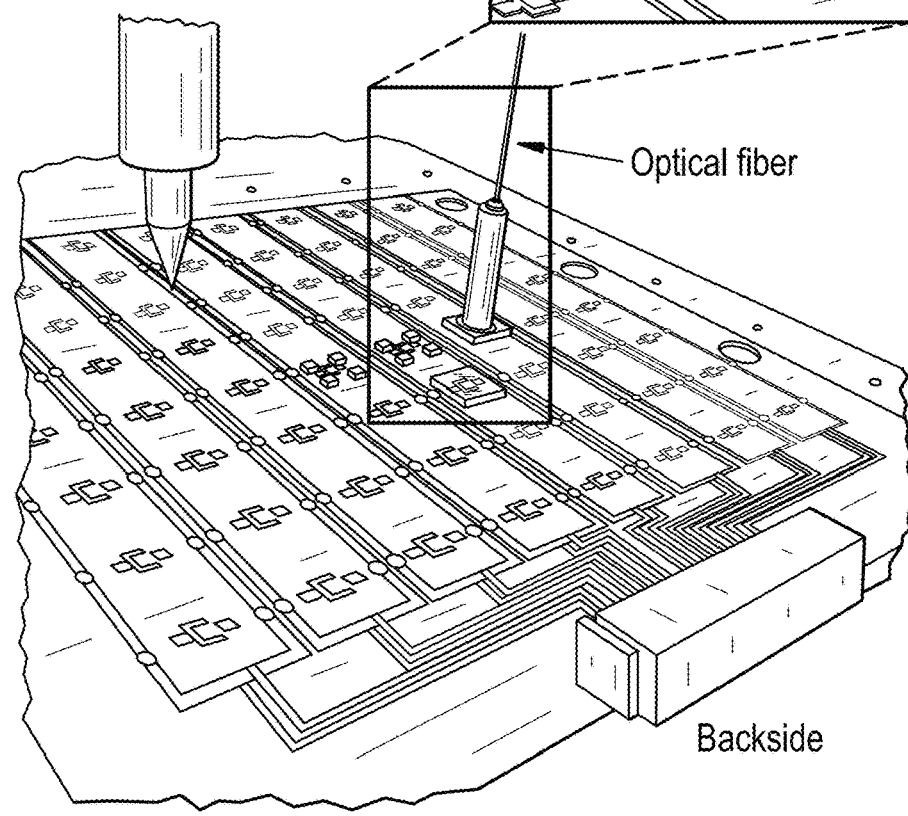

In addition, the bias voltage network resides on the backside of the PCB, visible in FIG. 9B. The positions where photodiodes are placed are marked in the figure. The bias lines are implemented with the narrowest wires available in the commercial PCB fabrication process, i.e., 50 µm or less, to reduce the loading impact on dipoles. For the same reason, the contacts of bias lines with the dipoles are located at points on the dipole arms where the RF current is relatively small: the RF current is much weaker at the center of dipoles than at the feeding points and edges. The cross polarization increases as the strength of the RF current excited on the bias lines increases. Setting up bias lines in this way is able to achieve more than 20 dB of isolation between the primary and cross polarizations.

A reliable integration process has been developed to integrate to an array of photodiodes and feeding optical fibers with a TCA. The photodiodes used (Albis Optoelectronics PDCS24L) have ground-signal-ground (GSG) pads with a pitch of 50 µm. Prior to the integration, the photodiode is flip-chip bonded onto a 4-mil ceramic substrate. Large bonding pads are available on the ceramic chip allowing for conducting wire bonding with the TCA.

A reliable method of attaching optical fibers to the TCA is required, subsequent to an active alignment procedure to position each fiber for optimal illumination of the photodiode.

TABLE 1

The measured responsivities of the four photodiodes.

| Element | Responsivity |
|---------|--------------|
| #1 | 0.35 |
| #2 | 0.35 |
| #3 | 0.39 |
| #4 | 0.33 |

Figure 9C:
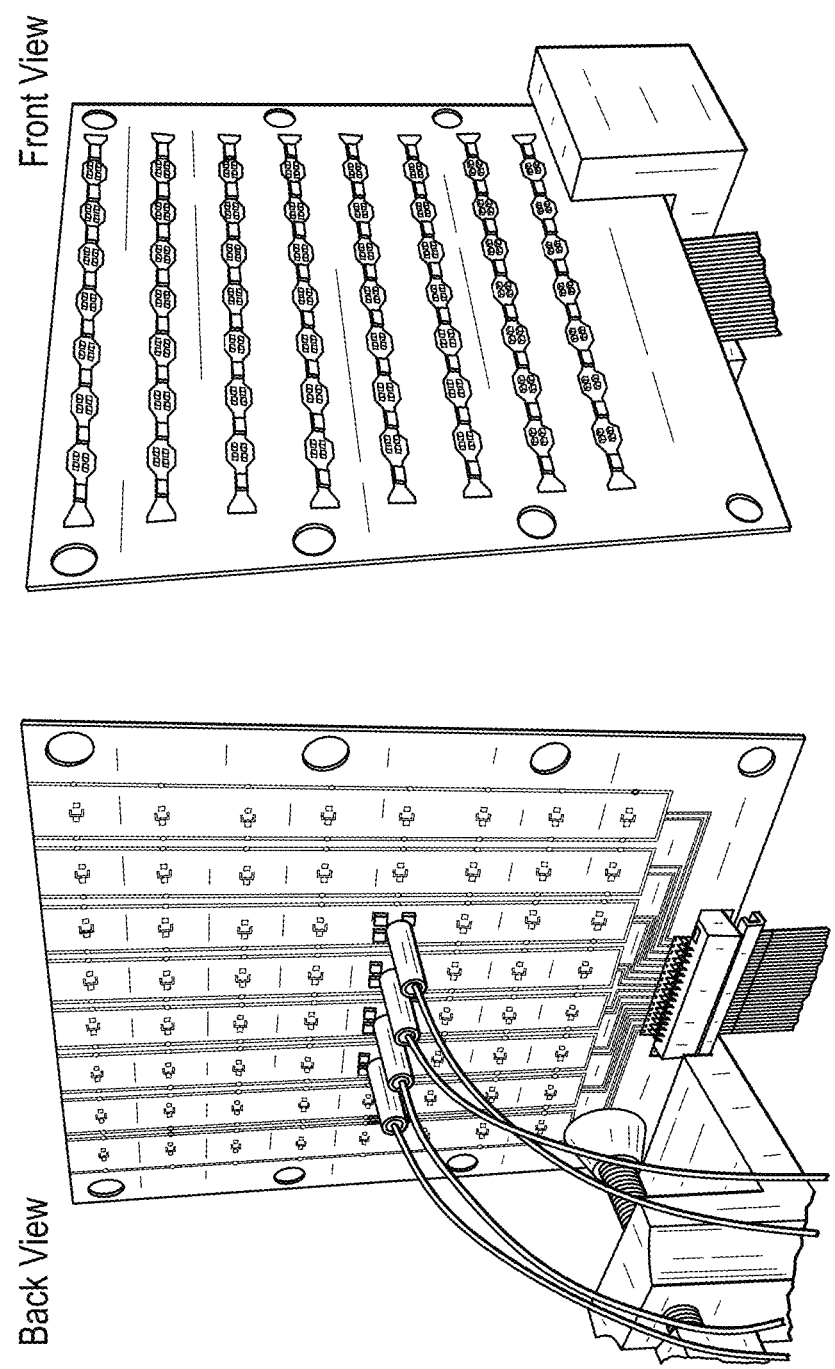
FIG. 9C shows a photodiode integrated 8×8 TCA with four optical fiber fed active elements.

To this end, each 900-µm single-mode fiber is threaded into a ceramic ferrule and then glued together. The optical fiber combined with the ferrule is polished to ensure a low optical reflection and coupling loss. Another larger piece of quartz chip is then glued on the polished ferrule in order to increase the bonding area. After these preparations, the photodiodes are glued on the PCB. Four small pieces of square quartz chips are then used as spacers, to close to the four respective corners of the photodiode. Finally, the optical fibers are aligned with the photodiodes and then the ferrules are glued to the quartz chips on the PCB. During the bonding process, optical signals are kept incident on the photodiodes to monitor alignment and bonding quality between photodiode and fiber lens until an optimal bonding is achieved by maximizing the output DC current from the photodiode. The integration procedure described above is shown in FIG. 9B. Repeating the process results in a four-element array, as shown in FIG. 9C. The achieved responsivities are listed in Table 1.

Previous work has demonstrated an optically addressed phased array by integrating commercially available photodiodes with a patch array antenna at the $K_a$ frequency band. In the present characterization setup, the developed transmitting TCA is fed by a four-channel optical feed network to demonstrate beam steering of the phased array. An UWB double-ridge horn with an operational bandwidth of 4-40 GHz is used as a receiving antenna. The received signals were measured by using an electrical spectrum analyzer and RF power meter. The measurement was conducted in an in-house anechoic chamber. The radiation power of each element was first measured as one element is excited at a time to characterize the radiation power over the frequency band from 3-12 GHz. The far-field measurement system was established, in which the transmitting phased array antenna and photonic RF receiver were arranged to face each other. The receiving antenna was set to be 2 meters away from the transmitting phased array antenna.

Figure 10A:
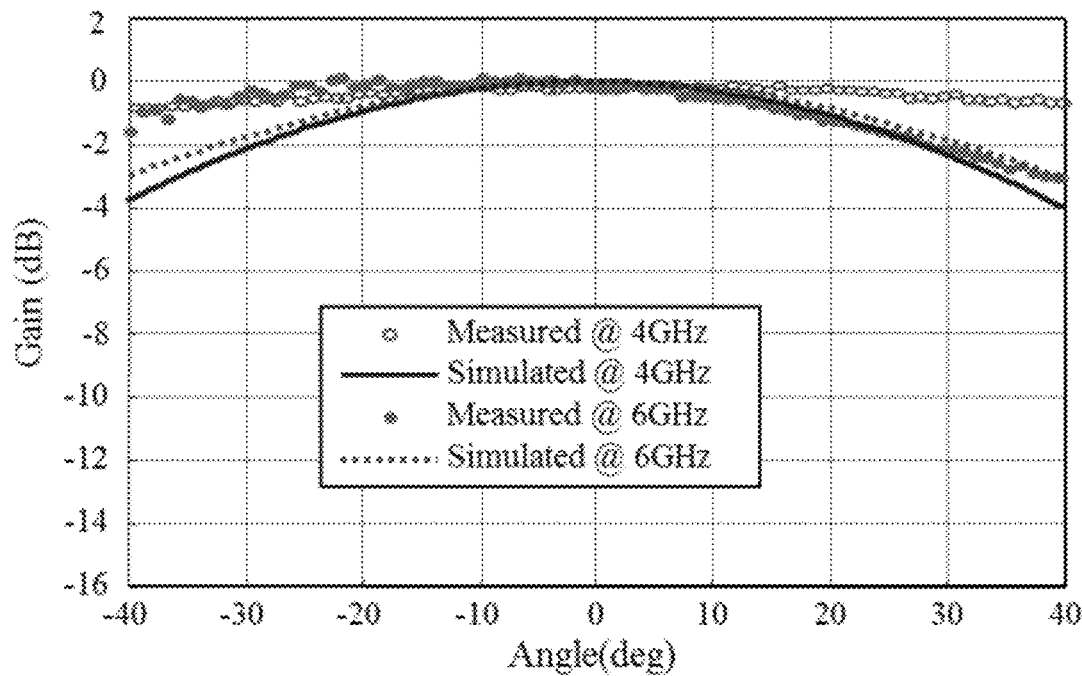
FIG. 10A shows the measured and simulated radiation patterns at frequencies of 4 GHz and 6 GHz.
Figure 10B:
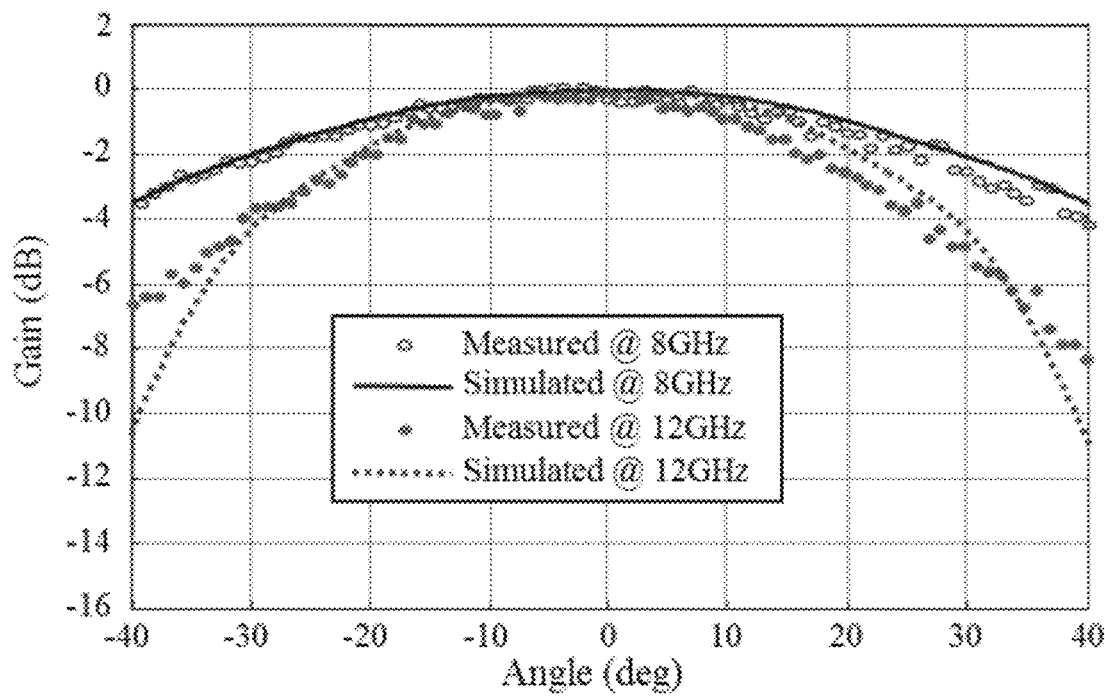
FIG. 10B shows the measured and simulated radiation patterns at frequencies of 8 GHz and 12 GHz.

FIGS. 10A and 10B show the comparison between the measured and simulated radiation patterns at the frequencies of 4 GHz, 6 GHz, 8 GHz, and 12 GHz, respectively. It is observed that the measurements are in good agreement with the simulations at 10 GHz and 12 GHz. However, the measured radiation beams are much wider than those simulated at 4 GHz and 6 GHz. This discrepancy might be resulted from the measurement since the test was performed at a frequency close to the cutoff frequency of the anechoic chamber. The chamber was designed over a frequency range from 3 GHz with a quiet zone of 30 dB.

Figure 11B:
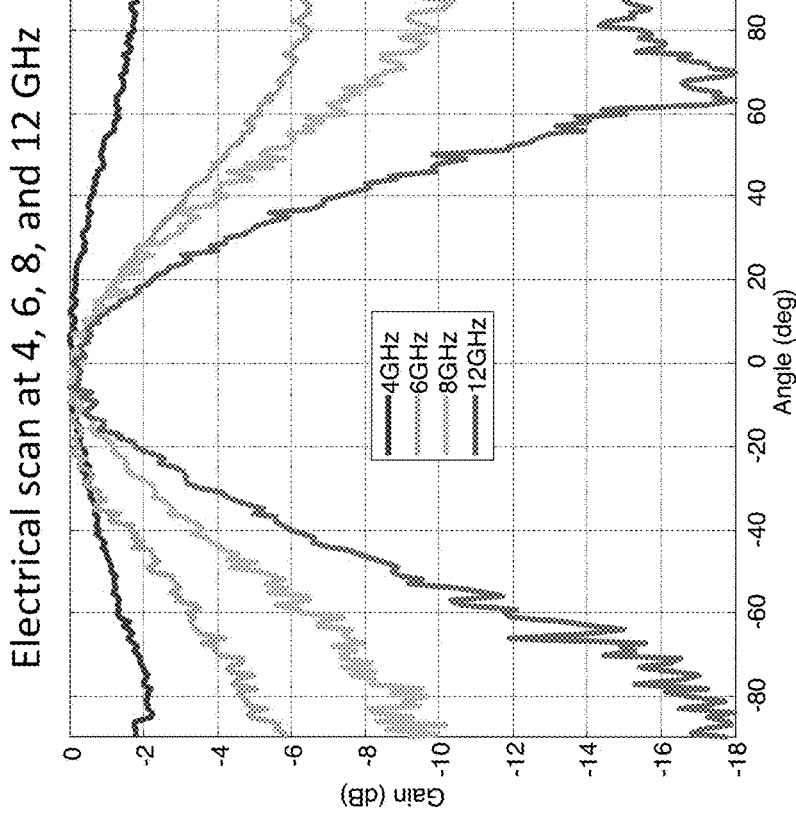
FIG. 11B shows beam steering of the TCA measured at 12 GHz.
Figure 11B:
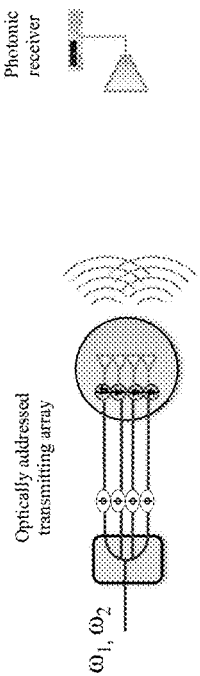
Figure 11A:
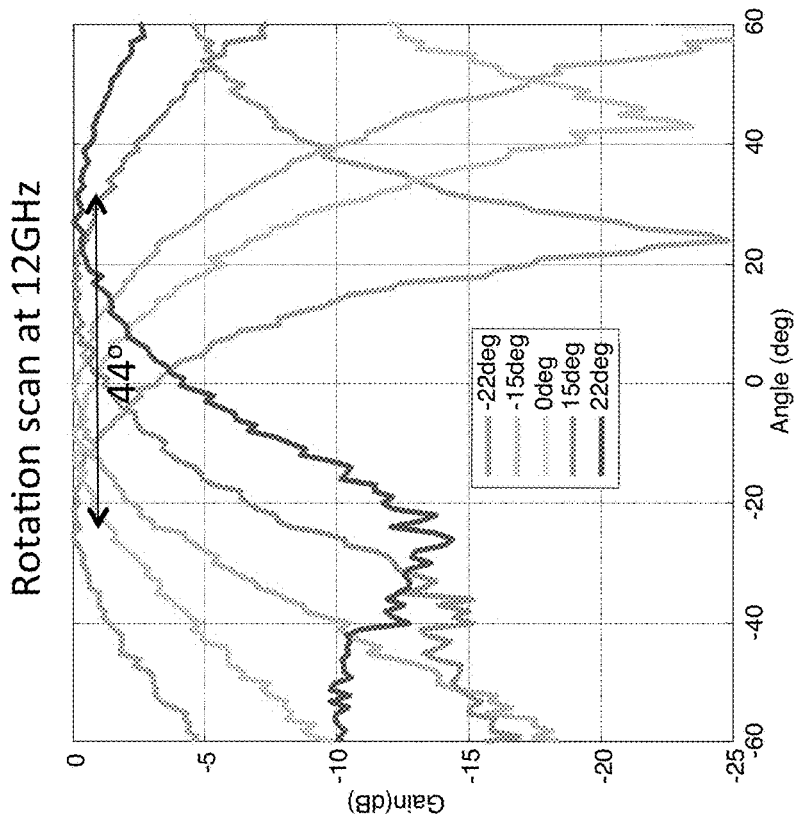
FIG. 11A shows the measured far-field patterns as a function of scanning angle with progressive phase applied to four radiating elements at different frequencies.
Figure 11A:
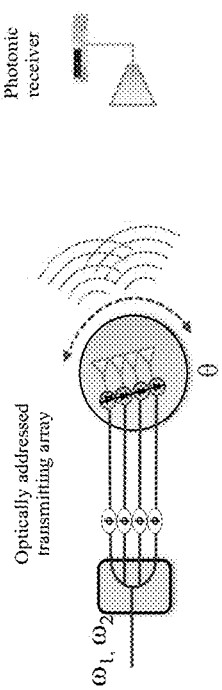

To demonstrate electronic beam steering, an embedded control system was used to actively control the DC bias of each phase modulator to phase the array. The necessary phase distribution can be determined based on the desired steering angle, the operational RF frequency, and antenna element spacing. An angular sweep range from −90° to 90° was set to demonstrate the beam steering. A progressive phase sequence was applied at each channel in the optical feed network to form a linear phase front at the TCA antenna, thereby producing an electrical beam steering without any mechanical movement involved. The peak far field corresponds to the broadside radiation of the phased array when equal phases are applied at all channels, as shown in FIG. 11A. Four different frequencies between 4-12 GHz are measured. As the frequency increases, the radiation beam width reduces and antenna gain increases.

In order to demonstrate the beam scanning capability, rotational scans of beam steering were conducted to measure the far-field radiation patterns of the developed phased array system. Due to small antenna counts in the array, the array has a low gain at the low operating frequencies; therefore, it was difficult to demonstrate beam steering. FIG. 11B shows the measured result of beam steering at 12 GHz. It is observed that over 44 degrees of beam steering was achieved.

The presently described exemplary implementations of the system architecture may serve as candidates for the next-generation of optically addressed multi-functional communication systems. In summary, full-wave simulations have been performed by incorporating multiple components into the photodiode-fed antenna to attain accurate system analysis. The exemplary implementations of TCA antennas are preferably fabricated and integrated on a multilayer high-frequency substrate. Inductance peaking and resistance matching may be employed to improve the antenna impedance bandwidth. System performance may be enhanced by feeding the antenna arrays with optical feed networks.

Although the disclosed exemplary antenna array implementations described herein may be designed to possess ultra-wide bandwidth and wide beam steering capability, it will be recognized that the embodiments described herein provide many improvements over the prior art which need not all be implemented in one device or system.

For example, use of an optical feed to provide an optical signal to a photodetector to drive a single antenna such as described with respect to a single unit cell 100a may provide a balanced signal to a dipole antenna without use of baluns or amplifiers, or may be used to drive a monopole antenna with a flexible optical fiber.

Figure 12A:
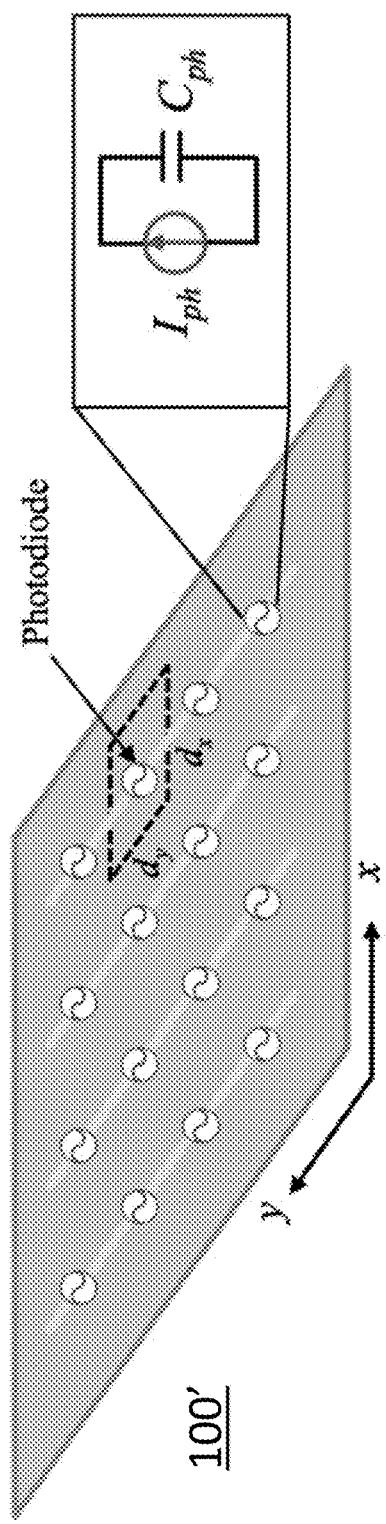
FIGS. 12A and 12B illustrate an embodiment where a connected array does not provide a gap between radiating elements.
Figure 12B:
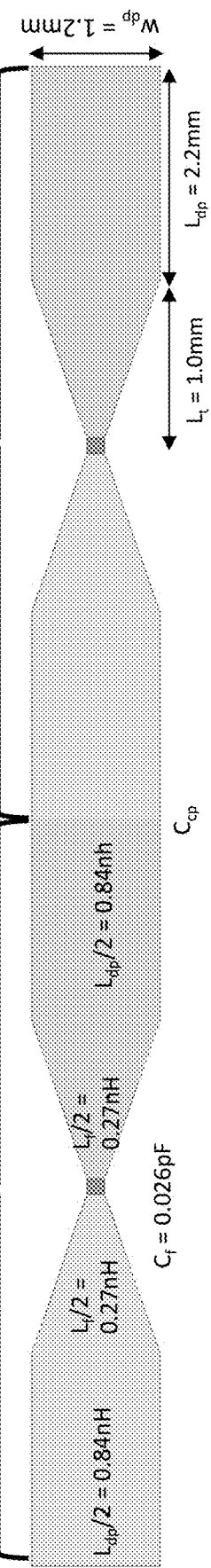

As another example, array 100 may be modified to be a connected array that does not provide a gap between radiating elements of neighboring antennas 10. FIG. 12A illustrates such an embodiment where connected array 100' may include the connected antennas 10', such as shown in FIG. 12B. The connected array 100' also provides an example where a ground plane need not be formed as part of the array 100' (in which case, the array may emit in a direction above and below substrate 12). All other features of connected array 100' may be the same as described with respect to TCA 100 of FIG. 1 (including the operation and structure of its unit cell 100a and alternatives thereto) and such detail is not repeated here.

Figure 13A:
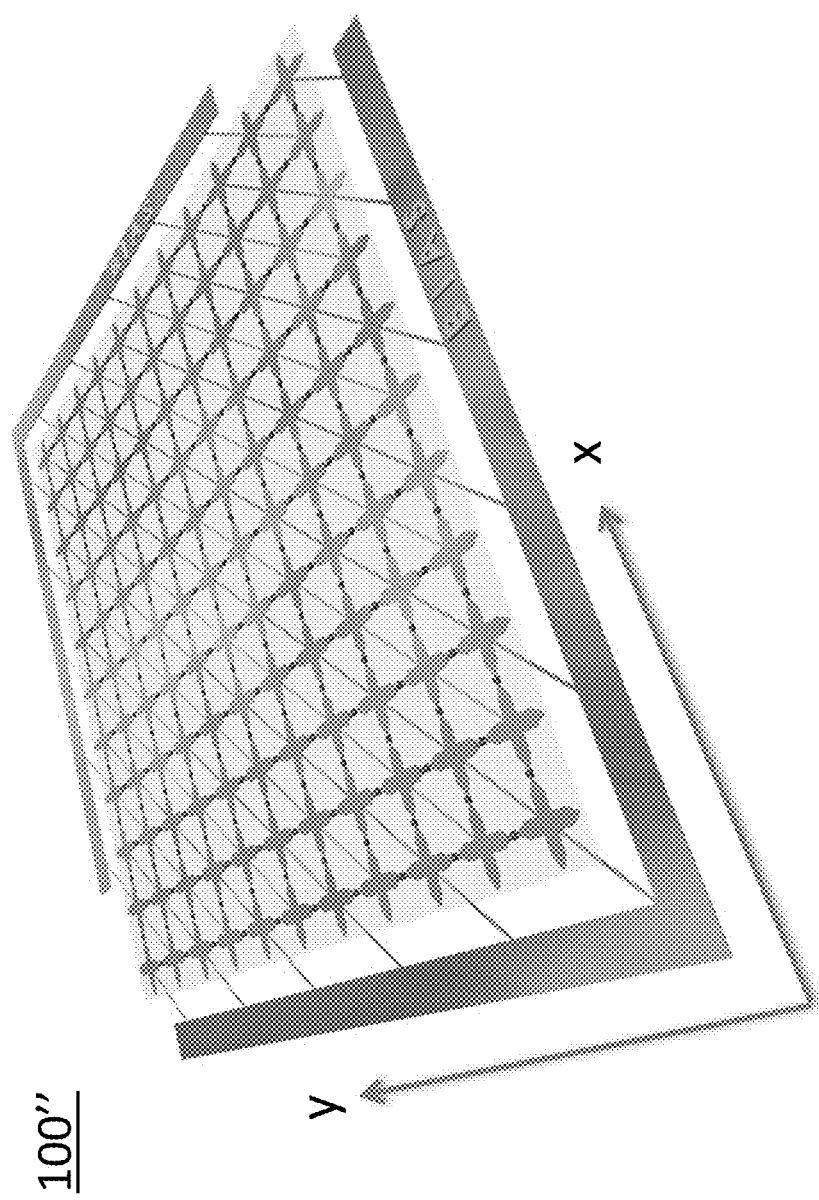
FIGS. 13A-13C illustrate an embodiment showing alternative features that may be implemented.
Figure 13B:
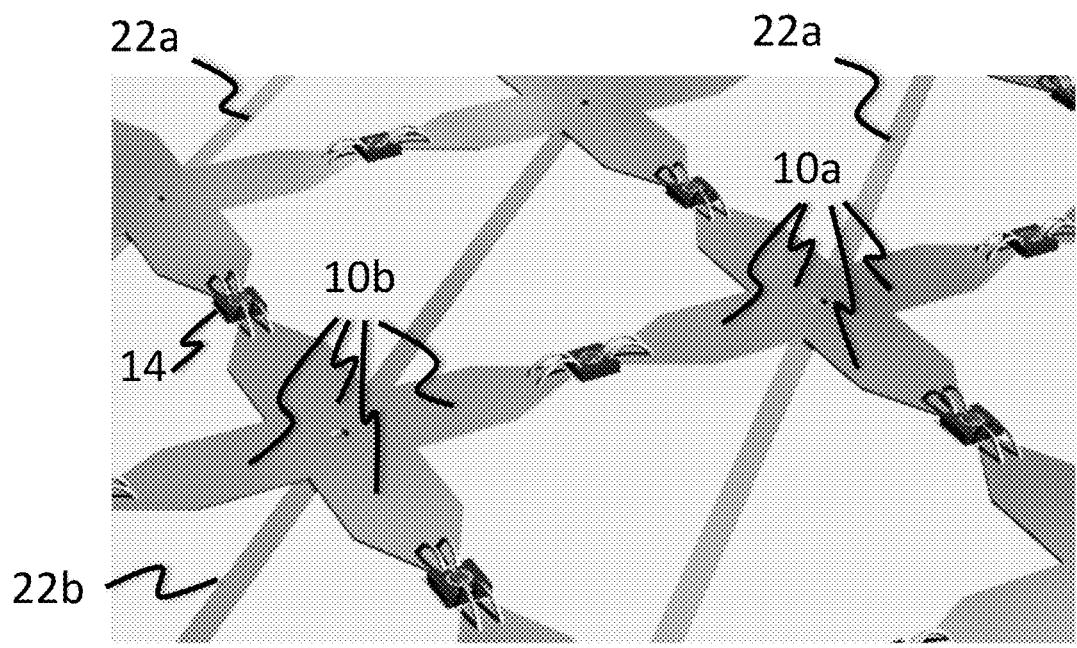
Figure 13C:
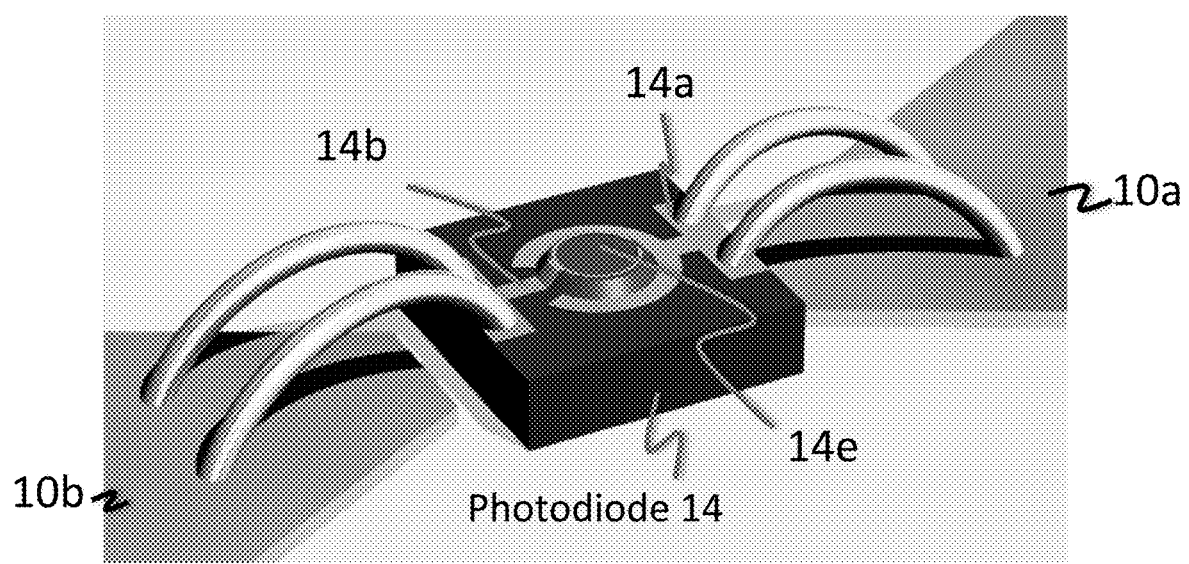

As another example, array 100 may be modified to have rows of connected antennas in two directions. FIG. 13A illustrates an exemplary array 100" where some dipole antennas 10 (each comprising two radiating arms 10a, 10b) are aligned in and extend in their lengthwise direction in the x-direction while other dipole antennas 10 are aligned in and extend in their lengthwise direction in the y-direction. As shown in FIG. 13B, array 100" includes anode bias lines 22a and cathode bias lines 13B extending at a diagonal (e.g., 45 degrees) with respect to the x and y directions. Each of four radiating arms 10a of different dipole antennas 10 are connected at their ends where there also is a connection to an anode bias line 22a. Similarly, each of four radiating arms 10b of different dipole antennas 10 are connected at their ends where there also is a connection to a cathode bias line 22b. These connections may be as described with respect to FIG. 1 via a capacitor 16 bridging a gap 16a between ends of the radiating arms 10a, 10b, or these connections may be as described with respect to FIGS. 12A and 12B where ends of the radiating arms 10a, 10b have a direct DC electrical connection, such as by merging the metal of the radiating arms 10a, 10b into a continuous metal sheet or plate. FIG. 13C illustrates an example modification where the photodiode 14 may be mounted on the same surface of the substrate 12 on which the dipole antennas (radiating arms 10a and 10b) are formed. FIG. 13C also illustrates a lens 14e integrated with the packaging of the photodiode 14. Other structure of array 100" and its unit cell may be the same as that of the other embodiments described herein and such detail is not repeated here.

What is claimed is:

1. An antenna array system, comprising:
a substrate;
a plurality of antennas mounted on said substrate and configured to operate as an antenna array, each antenna having first and second radiating arms extending in a first direction and having a length in the first direction of lambda/2; and
a plurality of photodiodes mounted on the substrate and a plurality of first conductors and a plurality of second conductors connecting the plurality of photodiodes to the plurality of antennas, each photodiode configured to generate an RF current to drive a corresponding antenna to which the photodiode is connected, each photodiode having an anode electrically connected to the first radiating arm of a corresponding antenna with a corresponding first conductor, and a cathode electrically connected to the second radiating arm of the corresponding antenna with a corresponding second conductor, wherein an extending length of the first conductor as measured from a first connection point of the corresponding first conductor to the anode to a second connection point of the corresponding first conductor to the first radiating arm is less than lambda/4, and wherein an extending length of the corresponding second conductor as measured from a first connection point of the corresponding second conductor to the cathode to a second connection point of the corresponding second conductor to the second radiating arm is less than lambda/4, wherein lambda is a length corresponding to the wavelength of the electromagnetic radiation that the antenna array is configured to emit at an upper range of the operational frequency of the antenna array.

2. The system of claim 1, wherein the radiating arms of adjacent ones of the plurality of antennas are directly electrically connected to each other.

3. The system of claim 1, wherein the radiating arms of adjacent ones of the plurality of antennas are electrically coupled to each other by a corresponding capacitor.

4. The system of claim 3, further including inter-digital capacitors each connected between the radiating arms of a corresponding antenna.

5. The system of claim 3, wherein each of the capacitors has a capacitance of 0.1 µF or greater.

6. The system of claim 1, further comprising resistors each connected across the radiating arms of a corresponding antenna.

7. The system of claim 1, wherein each first conductor and each second conductor comprises a corresponding spiral inductor.

8. The system of claim 1, wherein the system does not include any baluns.

9. The system of claim 1, wherein each of the photodiodes receives input signals via an optical fiber.

10. The system of claim 1, wherein said antennas are mounted on a first surface of the substrate, and the photodiodes are mounted on a second surface, opposite to the first surface, of the substrate.

11. The system of claim 1, wherein no RF amplifier is used to amplify the RF signals output by the photodiodes.

12. The system of claim 1, further comprising a plurality of optical fibers, each optical fiber being mounted at a position over a corresponding photodiode to emit light to be incident onto the corresponding photodiode.

13. The system of claim 12,
wherein each photodiode comprises a PIN diode comprising a p-doped semiconductor region, an intrinsic semiconductor region and an n-doped semiconductor region, where the anode of the photodiode is electrically connected to p-doped semiconductor region of the PIN diode and the cathode is electrically connected to the n-doped semiconductor region of the PIN diode.

14. The system of claim 13, wherein each first conductor and each second conductor are formed by a wiring layer of the substrate and a corresponding conductive via extending at least partially through the substrate connected to the wiring layer of the substrate.

15. The system of claim 1,
wherein the plurality of photodiodes are mounted on a first surface of the substrate, and
wherein, with respect to a vertical direction that is perpendicular to the first surface of the substrate, for each of the plurality of antennas, a first vertical distance between the antenna and the cathode of the corresponding photodiode to which the antenna is connected is less than 7 mm and a second vertical distance between the antenna and the anode of the corresponding photodiode is less than 7 mm.

16. The system of claim 1, wherein the system is an ultra-wideband tightly coupled phase array system.

17. The system of claim 1,
wherein the plurality of antennas of claim 1 comprise a plurality of first antennas, and
wherein the antenna array further comprises a plurality of second antennas mounted on said substrate and configured to operate with the plurality of first antennas, each second antenna having first and second radiating arms extending in a second direction that is perpendicular to the first direction and having a length in the second direction of L.

18. The system of claim 1,
wherein the plurality of first antennas are arranged in a plurality of first rows that extend in the first direction, each first row containing several of the plurality of first antennas, and
wherein the plurality of second antennas are arranged in a plurality of second rows that extend in the second direction and cross the plurality of first rows, each second row containing several of the plurality of second antennas.

19. The system of claim 18, further comprising a plurality of anode bias lines and a plurality of cathode bias lines that extend at a diagonal with respect to both the first and second directions, each of the anode bias lines and each of the cathode bias lines connected to radiating arms of corresponding ones of the first antennas and the second antennas.

20. The system of claim 1, wherein each first conductor and each second conductor comprises a corresponding inductor and a corresponding capacitor.

21. The system of claim 1, further comprising a plurality of anode bias lines and a plurality of cathode bias lines, each of the anode bias lines electrically connecting a corresponding subgroup of first radiating arms of the antennas and each of the cathode bias lines electrically connecting a corresponding subgroup of second radiating arms of the antennas.

22. An antenna array system, comprising:
a substrate;
a plurality of antennas mounted on said substrate and configured to operate as an antenna array, each antenna having first and second radiating arms extending in a first direction and having a length in the first direction of lambda/2; and
a plurality of photodiodes provided on the substrate, each photodiode configured to generate an RF signal to drive a corresponding antenna to which the photodiode is connected, each photodiode having an anode electrically connected to the first radiating arm of a corresponding antenna with a corresponding first electrical path comprising a corresponding first conductor, and a cathode electrically connected to the second radiating arm of the corresponding antenna with a corresponding second electrical path comprising a corresponding second conductor,
wherein each first electrical path and each second electrical path does not include an RF amplifier, and
wherein lambda is a length corresponding to the wavelength of the electromagnetic radiation that the antenna array is configured to emit at an upper range of the operational frequency of the antenna array.

23. The system of claim 22, wherein the system does not include any RF transmission lines to provide an RF signal to the antennas.

24. The system of claim 22, further comprising a plurality of anode bias lines and a plurality of cathode bias lines, each of the anode bias lines electrically connecting a corresponding subgroup of first radiating arms of the antennas and each of the cathode bias lines electrically connecting a corresponding subgroup of second radiating arms of the antennas.

25. The system of claim 22,
   wherein an extending length of each first electrical path is less than lambda/4, and
   wherein an extending length of each second electrical path is than lambda/4.

* * * * *